United States Patent
Kono

(10) Patent No.: US 6,768,698 B2
(45) Date of Patent: Jul. 27, 2004

(54) SEMICONDUCTOR MEMORY DEVICE WITH INTERNAL CLOCK GENERATION CIRCUIT

(75) Inventor: Takashi Kono, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/255,667

(22) Filed: Sep. 27, 2002

(65) Prior Publication Data

US 2003/0185088 A1 Oct. 2, 2003

(30) Foreign Application Priority Data

Mar. 29, 2002 (JP) ........................................ 2002-093397

(51) Int. Cl.$^7$ .............................. G11C 7/22; G11C 8/18
(52) U.S. Cl. ..................... 365/233; 365/193; 365/194; 365/189.05
(58) Field of Search ................................. 365/233, 195, 365/194, 233.5, 193, 189.05, 227

(56) References Cited

U.S. PATENT DOCUMENTS 5,991,229 A * 11/1999 Kim et al. .................. 365/233
6,337,833 B1 * 1/2002 Kanazashi et al. .......... 365/233
2003/0076726 A1 * 4/2003 Cowles et al. .............. 365/222

FOREIGN PATENT DOCUMENTS

JP      P2000-30456 A       1/2000

* cited by examiner

Primary Examiner—Vu A. Le
Assistant Examiner—J. H. Hur
(74) Attorney, Agent, or Firm—McDermott Will & Emery LLP

(57) ABSTRACT

A repeater receives an internal clock distributed from a DLL circuit irrespective of a data reading operation and outputs a DLL clock to a data output circuit and a data strobe signal output circuit in response to an internal signal only in the data reading operation. The data strobe signal output circuit receives the internal clock and the DLL clock, generates a data strobe signal in synchronization with the internal clock, and outputs the generated data strobe signal in synchronization with the DLL clock. As a result, a semiconductor memory device attains further reduction of power consumption during active-standby and a secure supply of the internal clock to a prescribed circuit.

12 Claims, 25 Drawing Sheets

F I G. 1
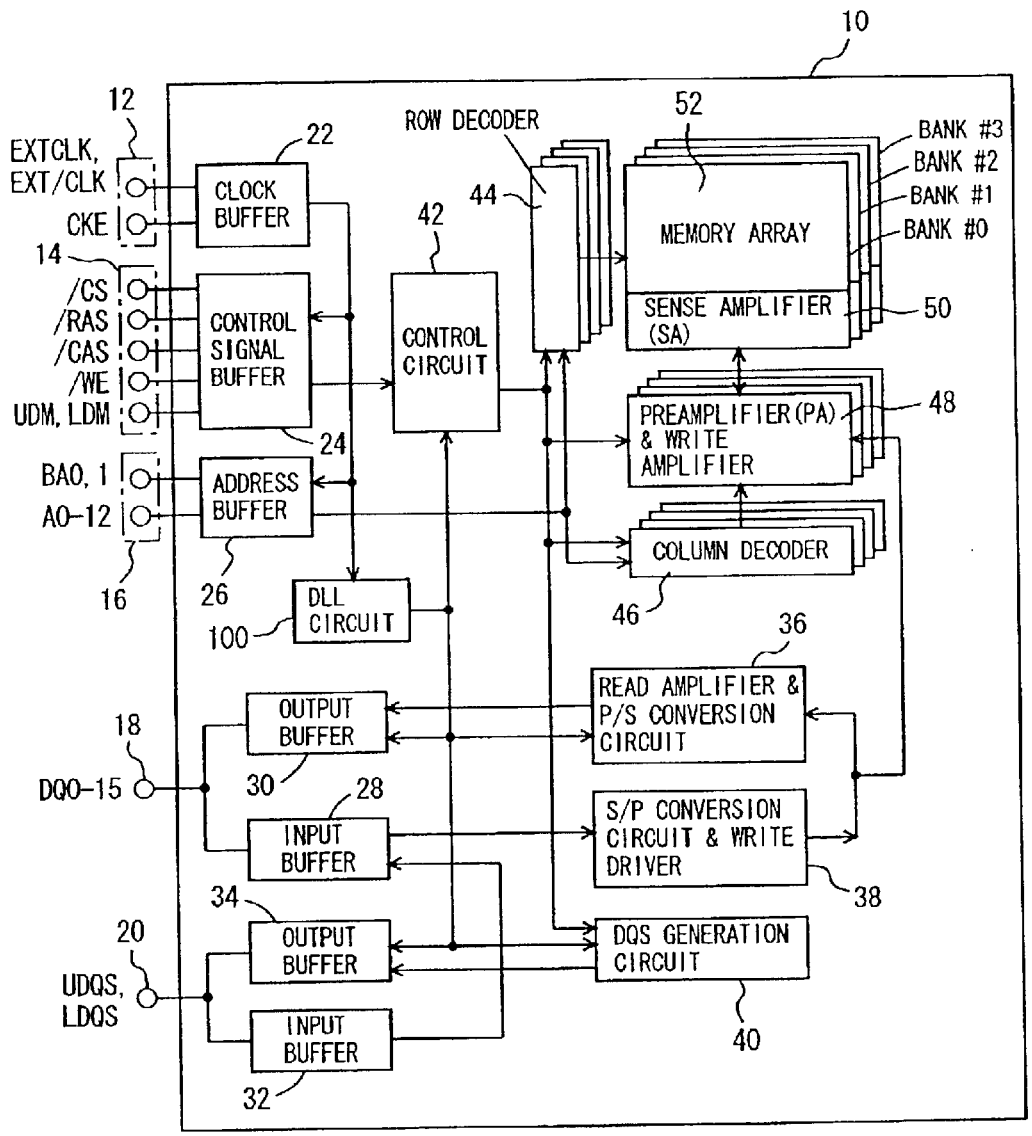

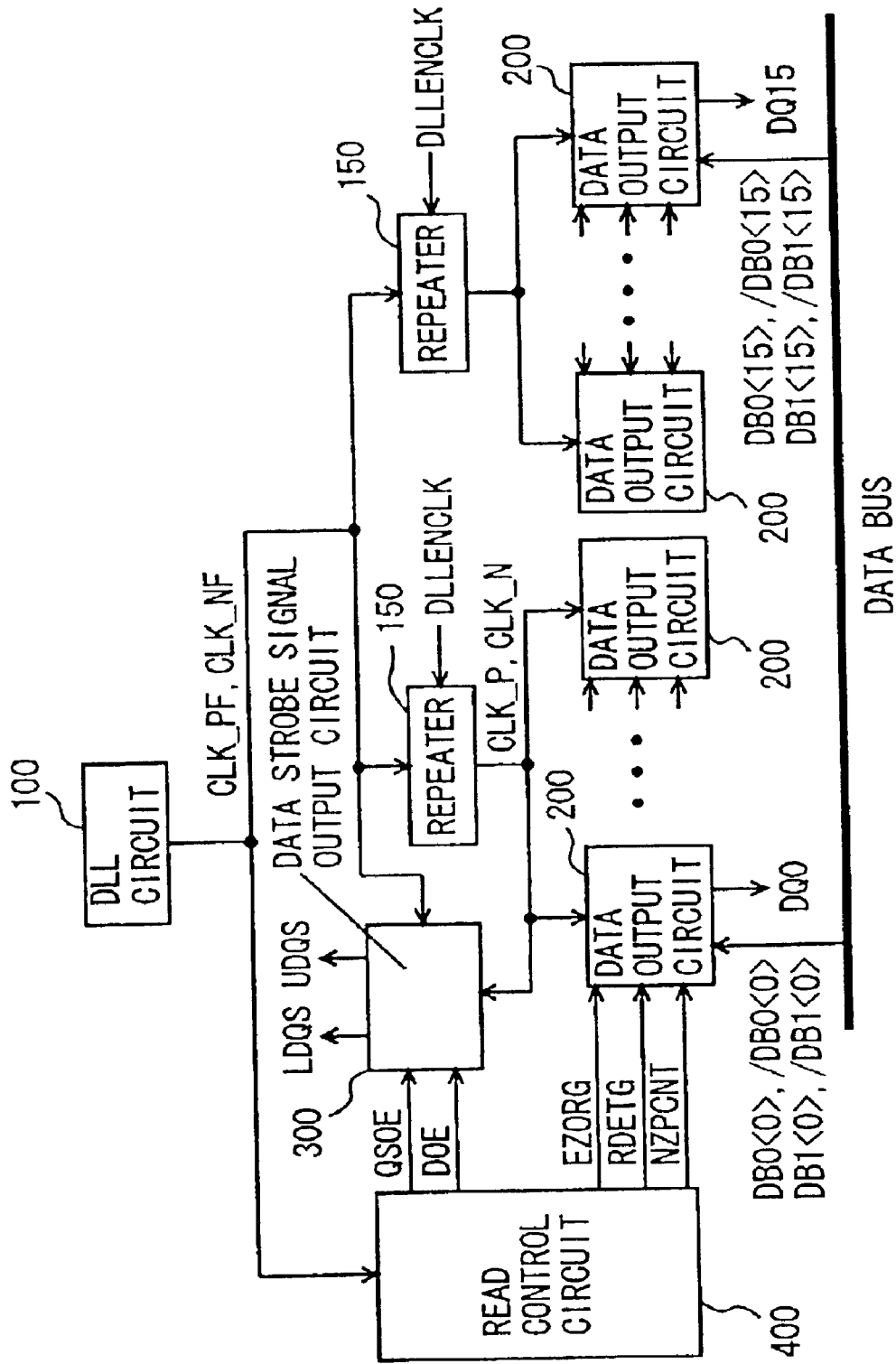
F I G. 2

SEMICONDUCTOR MEMORY DEVICE WITH INTERNAL CLOCK GENERATION CIRCUIT

BACKGROUND OF THE INVENTION

1. Field of the Invention

The present invention relates to a semiconductor memory device, and more particularly to a semiconductor memory device with an internal clock generation circuit operating in synchronization with a rise and a fall of an external clock and generating an internal clock synchronized with the external clock.

2. Description of the Background Art

Generally, an SDRAM (Synchronous Dynamic Random Access Memory) operating in synchronization with an external clock includes therein a clock generation circuit which generates an internal clock synchronized with the external clock. Using this internal clock, an internal circuit in SDRAM is controlled.

More specifically, a circuit controlling data input/output for SDRAM to communicate data with the outside is also controlled by this internal clock. Therefore, the timing of data input/output is largely affected by the phase accuracy of the internal clock.

Meanwhile, by the demand for a higher frequency operation of a semiconductor device, a DDR SDRAM (Double Data Rate SDRAM) is developed and brought into practical use, in which data is input/output in synchronization with rising and falling edges of an external clock. In this DDR SDRAM, it is particularly demanded to further reduce a phase difference between an edge of an external clock and data input/output timing for DDR SDRAM, as compared with a conventional SDRAM. Specifically, since DDR SDRAM allows data input and output at a frequency rate double the conventional SDRAM, the phase shift between the edge of the external clock and the data input/output timing is larger relative to the period of the external clock.

FIG. 12 is a timing chart showing data output timing in reading data from a DDR SDRAM, that is a so-called DDR-I. In this DDR SDRAM, a CAS latency CL is set at 2.5 and a burst length BL is set at 4. The CAS latency represents here the number of cycles (one cycle corresponds to the time period from a rise of an external clock EXTCLK to the next rise) for the DDR SDRAM to receive a READ command (a command for reading data) from the outside and then to start to output the read data to the outside. The burst length represents the number of bits successively read out in response to READ command.

Referring to FIG. 12, DDR-I outputs data DQ of the read data and a data strobe signal DQS in synchronization with external clocks EXTCLK, EXT/CLK. The external clock EXT/CLK here is a clock signal complementary to the external clock EXTCLK. The data strobe signal DQS is used as a timing to take in data DQ on the side of an external controller receiving data DQ.

A timing difference tAC between the edges of external clocks EXTCLK, EXT/CLK and the output of data DQ is defined to fall within a certain range. In FIG. 12, timing difference tAC is controlled to be zero. Furthermore, an output timing difference tDQSQ between data strobe signal DQS and data DQ also needs to fall within a certain range.

In addition, in DDR-I, data strobe signal DQS in reading data is defined to be generated (CAS latency CL-1) cycle before data DQ starts to be output. This period is called "preamble". It is also defined that data strobe signal DQS is at L (logic low) level during half cycle after the final data of data DQ starts to be output. This period is called "postamble".

In order to realize a data output as shown in FIG. 12, an operation clock is required of which timing is slightly earlier than that of the edge of external clock EXTCLK, in a data output circuit. This is because a delay is occurred before data is actually output after an external clock is input into a semiconductor memory device, because of a capacitance of each internal circuit.

More specifically, what is needed is a clock generation circuit operating in a manner as follows. As external clock EXTCLK is a fixed cycle signal, internal clocks CLK_P, CLK_N shifted backward by an adequate amount of time Ta with respect to the edge of external clock EXTCLK are generated by delaying external clock EXTCLK by an adequate amount of delay Td. Furthermore, delay amount Td can be controlled such that data DQ output from the data output circuit and data strobe signal DQS output from a data strobe signal output circuit, which operate triggered by these internal clocks CLK_P and CLK_N, satisfy the differences tAC and tDQSQ described above. A circuit that generates such an internal clock is called a DLL (Delay Locked Loop) circuit.

The backward amount Ta is determined from a propagation time from taking in the read data triggered by internal clocks CLK_P, CLK_N to ultimately reading out the read data to a data output terminal. Then, as shown in FIG. 12, when CAS latency is 2.5, the first data of data DQ is output in synchronization with the rising edge of EXT/CLK (the falling edge of EXTCLK), and thereafter odd numbered data and even numbered data of data DQ are sequentially output to the outside, respectively triggered by internal clocks CLK_N and CLK_P.

FIG. 13 is a schematic block diagram conceptually illustrating an overall configuration of an READ-related circuitry operating with an internal clock generated in the DLL circuit described above.

Referring to FIG. 13, a DLL circuit 100 outputs an internal clock CLK_PF generated by delaying external clock EXTCLK and an internal clock CLK_NF generated by delaying external clock EXT/CLK. A repeater 120 receives internal clocks CLK_PF and CLK_NF distributed from DLL circuit 100 and outputs them as DLL clocks CLK_P and CLK_N.

A plurality of data output circuits 200 are provided based on a word organization to which DDR SDRAM corresponds. Here, sixteen data output circuits 200 outputting data DQ0–DQ15 are provided. Each data output circuit 200 receives DLL clocks CLK_P and CLK_N output from repeater 120, is activated by either of DLL clock CLK_P or CLK_N selected based on an internal signal NZPCNT received from a READ control circuit 400, and takes in and externally outputs data read from a memory cell array onto a data bus.

As shown in FIG. 13, a signal path from DLL circuit 100 to data output circuits 200 is generally formed like a tree. The circuits and signal lines are arranged such that the data output timings do not vary among a plurality of data output circuits 200. A repeater 120 is generally arranged for every eight data output circuits or every four data output circuits.

A data strobe signal output circuit 500 generates and externally outputs data strobe signals LDQS and UDQS which indicate of timing for externally outputting the read data output from data output circuit 200. Data strobe signal output circuit 500 receives DLL clocks CLK_P and CLK_N output from repeater 120, generates data strobe signals LDQS and UDQS during the period from preamble to postamble using an internal signal QSOE received from READ control circuit 400, in synchronization with DLL clocks CLK_P and CLK_N, and externally outputs the generated data strobe signals LDQS and UDQS.

READ control circuit 400 operates in synchronization with internal clocks CLK_PF and CLK_NF received from DLL circuit 100, generates a variety of signals required for a data reading operation in response to READ command, and outputs the signals to data output circuit 200 and data strobe signal output circuit 500. Internal signals QSOE, DOE, EZORG, RDETG and NZPCNT will be described later in the description of data output circuit 200 and data strobe signal output circuit 500 using these signals.

FIG. 14 is a functional block diagram illustrating DLL circuit 100.

Referring to FIG. 14, DLL circuit 100 includes variable delay circuits 206 and 208, pulse generation circuits 210 and 212, an input/output replica circuit 214, a phase comparator 216 and a delay control circuit 218.

An input buffer 202 receiving external clocks EXTCLK and EXT/CLK input from the outside and outputting an internal clock BUFFCLK_DLL to DLL circuit 100 detects a cross point between a potential level in the rise of external clock EXTCLK and a potential level in the fall of the inverted signal thereof, external clock EXT/CLK, and generates internal clock BUFFCLK_DLL. On the other hand, an input buffer 204 detects a cross point between a potential level at which external clock EXTCLK falls and a potential level at which an external clock EXT/CLK rises, and generates an internal clock BUFF/CLK_DLL.

Variable delay circuit 206 delays internal clock BUFFCLK_DLL received from input buffer 202 to be output to pulse generation circuit 210. Variable delay circuit 206 includes a plurality of delay units generating delays, and delays internal clock BUFFCLK_DLL by connecting/disconnecting the delay units based on an instruction from delay control circuit 218.

Pulse generation circuit 210 generates internal clock CLK_PF as a pulse signal synchronized with a rising edge of a signal output from variable delay circuit 206.

Variable delay circuit 208 delays internal clock BUFF/CLK_DLL received from input buffer 204 to be output to pulse generation circuit 212. The configuration of variable delay circuit 208 is same as that of variable delay circuit 206 and therefore description thereof will not be repeated.

Pulse generation circuit 212 generates internal clock CLK_NF as a pulse signal synchronized with a rising edge of a signal output from variable delay circuit 208.

Input/output replica circuit 214 reproduces in a simulated manner input buffer 202 and circuit characteristics from internal clocks CLK_PF and CLK_NF being output from DLL circuit 100 to data DQ being output to a data input/output terminal, and applies in a simulated manner the delay amount created in these circuits to internal clock CLK_PF.

Phase comparator 216 compares the phases between internal clock FBCLK output from input/output replica circuit 214 and internal clock BUFFCLK_DLL after one cycle or few cycles, and generates control signals UP and DOWN for increasing/decreasing the delay amount of variable delay circuits 206 and 208 based on that phase difference.

Delay control circuit 218 adjusts the delay amount in variable delay circuits 206 and 208 by generating a delay control signal based on control signals UP and DOWN and outputting the same to variable delay circuits 206 and 208. When the phases match between internal clock BUFFCLK_DLL and the internal clock FBCLK, neither control signal UP nor DOWN is output from phase comparator 216, the delay control signal is of a fixed value, and thus the delay amount in variable delay circuits 206 and 208 is fixed.

Therefore, internal clocks CLK_PF and CLK_NF has a phase earlier than external clocks EXTCLK and EXT/CLK by the sum of the delay amount from DLL circuit 100 to data output circuit 200 and the data output delay amount in data output circuit 200. Accordingly, when the delay amount applied in input/output replica circuit 214 matches the delay amount in input buffer 202, repeater 120 and data output circuit 200, the timing difference tAC described above is zero.

On the other hand, when the phases do not match between internal clock BUFFCLK_DLL and internal clock FBCLK, control signal UP or DOWN is output from phase comparator 216 according to the phase difference, and the delay amount is adjusted by connecting/disconnecting the delay units in variable delay circuits 206 and 208.

FIG. 15 is a circuit diagram showing a circuit configuration of repeater 120.

Referring to FIG. 15, repeater 120 is configured with inverters 1202–1208. Repeater 120 receives internal clock CLK_PF and outputs DLL clock CLK_P through inverters 1202 and 1204. Furthermore, repeater 120 receives internal clock CLK_NF and outputs DLL clock CLK_N through inverters 1206 and 1208.

FIG. 16 is a functional block diagram illustrating data output circuit 200.

Referring to FIG. 16, data output circuit 200 includes amplifier circuits 362 and 364, a parallel/serial conversion circuit 366, an output data latch circuit 302, an output driver circuit 304 and a clock select circuit 220.

In case of DDR-I described above, reading data from the memory cell array every one cycle is premised on a two-bit prefetch operation in which data of two bits is read for each data output circuit in a single readout. More specifically, data of two bits is read from the memory cell array to data output circuit 200 at one time every one cycle. The data of two bits is ordered in data output circuit 200 and is transferred every half cycle to be output to the outside.

Amplifier circuits 362 and 364 receive an internal signal RDETG output from READ control circuit 400. Amplifier circuit 362 is connected to a data bus pair DB0 and /DB0 and amplifier circuit 364 is connected to a data bus pair DB1 and /DB1 while internal signal RDETG is at H (logic high) level. Internal signal RDETG is a signal for taking in data from the data bus pair in amplifier circuits 362 and 364 and is controlled in READ control circuit 400 such that it goes to H level at a prescribed timing.

Amplifier circuit 362 operates every one cycle in synchronization with DLL clock CLKQ output from clock select circuit 220, reads data read out from the memory cell array onto the data bus pair DB0 and /DB0, and amplifies the signal level of the read data for outputting to parallel/serial conversion circuit 366. Similar to amplifier circuit 362, amplifier circuit 364 operates every one cycle in synchronization with DLL clock CLKQ, reads data read out from memory cell array onto the data bus pair DB1 and /DB1 at the same timing as the data read out onto the data bus pair DB0 and /DB0, and amplifies the signal level of the read data for outputting to parallel/serial conversion circuit 366.

Similar to amplifier circuits 362 and 364, parallel/serial conversion circuit 366 operates every one cycle in synchronization with DLL clock CLKQ, receives data RD0 and /RD0 (which are complementary signals and one-bit data) and data RD1 and /RD1 respectively output from amplifier circuits 362 and 364, and orders data RD0 and /RD0 as well as data RD1 and /RD1 based on internal signal EZORG output from READ control circuit 400 for outputting to output data latch circuit 302. Here, internal signal EZORG reflects information of the least significant bit CA0 of a column address applied simultaneously with READ command and is generated in READ control circuit 400 based on CA0.

Output data latch circuit 302 receives and latches data RDD, /RDD output from parallel/serial conversion circuit 366, and transfers the data to output driver circuit 304 bit by bit, in synchronization with DLL clocks CLK, /CLK0 output from clock select circuit 220 and operating every half cycle. Output driver circuit 304 then outputs data DQi to the outside through a data input/output terminal 18.

Clock select circuit 220 generates DLL clock CLKQ activating amplifier circuits 362 and 364 and parallel/serial conversion circuit 366 as well as DLL clocks CLKO, /CLKO activating output data latch circuit 302, based on DLL clocks CLK_P and CLK_N.

As described above, DDR-I employs a two-bit prefetch configuration in which data of two bits read every one cycle is transferred serially to output driver circuit 304 every half cycle, and therefore clock select circuit 220 needs to generate DLL clock CLKQ starting from either DLL clock CLK_P or CLK_N according to the first data output timing.

Accordingly, clock select circuit 220, in view of CAS latency defining the first data output timing, generates DLL clock CLKQ by selecting either internal clock CLK_P or CLK_N based on internal signal NZPCNT having different logic levels depending on whether CAS latency is an integer or a half-integer, and outputs the same to amplifier circuits 362 and 364 and parallel/serial conversion circuit 366 to activate these circuits.

Clock select circuit 220 also generates DLL clocks CLKO, /CLKO which trigger data RDD, /RDD received by output data latch circuit 302 from parallel/serial conversion circuit 366 to be transferred to output driver circuit 304 bit by bit every half cycle. DLL clock CLKO is a clock signal formed by OR of DLL clocks CLK_P and CLK_N. DLL clock /CLKO is a signal complementary to DLL clock CLKO.

In this way, data DQ is output from data output circuit 200 at the timing shown in FIG. 12.

As described above, for data DQ in order to be taken in at the outside of the device, data strobe signal DQS output in synchronization with data DQ needs to be referred to externally.

FIG. 17 is a functional block diagram illustrating data strobe signal output circuit 500. In FIG. 13, two data strobe signals LDQS and UDQS respectively corresponding to the lower bit and the upper bit of the output data DQ are output from data strobe signal output circuit 500. Although separate circuits are provided for outputting these two signals, only a circuit for either one of signals is shown in FIG. 17 as the circuit configurations are same.

Referring to FIG. 17, data strobe signal output circuit 500 includes a QSOE shift circuit 502, an output data generation circuit 504, an output data latch circuit 506, an output driver circuit 508 and a clock generation circuit 510.

Clock generation circuit 510 receives DLL clocks CLK_P and CLK_N output from repeater 120 and further receives an internal signal DOE output from READ control circuit 400, and generates control clocks CQP and CQN activating QSOE shift circuit 502 and output data generation circuit 504 as well as DLL clocks CLKO and /CLKO activating output data latch circuit 506. Here, internal signal DOE is a signal that goes to H level during READ operation.

QSOE shift circuit 502 receives internal signal QSOE output from READ control circuit 400 and generates signals QSOE1 and QSOE2 by shifting internal signal QSOE by a prescribed amount in synchronization with control clocks CQP and CQN output from clock generation circuit 510.

Here, internal signal QSOE is a signal for determining a column activation period based on burst length BL and goes to H level during (burst length BL/2) cycle after receiving READ command. The generated signal QSOE1 is a signal for determining the preamble period. Signal QSOE2 is a signal for determining the period in which a transition of data strobe signal DQS takes place in synchronization with data DQ.

Output data generation circuit 504, in synchronization with control clocks CQP and CQN output from clock generation circuit 510, generates data RDA and /RDA for generating data strobe signal DQS from the start of the preamble period to the end of the postamble period, based on signals QSOE1 and QSOE2 output from QSOE shift circuit 502.

Output data latch circuit 506 and output driver circuit 508 operate every half cycle in synchronization with DLL clocks CLKO and /CLKO output from clock generation circuit 510. Output data latch circuit 506 and output driver circuit 508 have the same circuit configurations as output data latch circuit 302 and output driver circuit 304, respectively, in data output circuit 200 shown in FIG. 16.

As described above, ideally, there is no phase difference between the outputs of data DQ and data strobe signal DQS. Practically, the output timings of these signals need to be controlled such that timing difference tDQSQ between both signals falls within a prescribed time. Therefore, also in output data latch circuit 506 in data strobe signal output circuit 500, DLL clocks CLKO and /CLKO generated from DLL clocks CLK_P and CLK_N serve as the output trigger for data strobe signal DQS in a manner similar to output data latch circuit 302 in data output circuit 200.

In practice, output data latch circuit 506 and output driver circuit 508 are configured to include transistors having the same dimensions as output data latch circuit 302 and output driver circuit 304 in data output circuit 200, and in addition they are designed such that timing difference tDQSQ is as small as possible for example by sharing a common configuration layout.

FIGS. 18 and 19 are circuit diagrams showing a circuit configuration of clock generation circuit 510.

Referring to FIGS. 18 and 19, clock generation circuit 510 includes a first internal circuit 510A and a second internal circuit 510B. The first internal circuit 510A includes a /CLK_PE generation circuit 512 and a /CLK_NE generation circuit 514. The second internal circuit 510B includes a CLKO generation circuit 516, a CQP generation circuit 518 and a CQN generation circuit 520.

Referring to FIG. 18, /CLK_PE generation circuit 512 includes NAND gates 5121–5123, delay circuits 5124–5126 and inverters 5127–5129.

/CLK_PE generation circuit 512 generates a falling pulse signal /CLKF_P having the pulse width of delay time by delay circuit 5125 in synchronization with the rising edge of DLL clock CLK_P when internal signal DOE is at H level. Furthermore, /CLK_PE generation circuit 512 generates a falling pulse signal /CLK_PE having the pulse width of the delay time by delay circuit 5126 plus the delay time by delay circuit 5125 in synchronization with the rising edge of DLL clock CLK_P.

In the following, the operation of /CLK_PE generation circuit 512 will be described.

When internal signal DOE is at H level, NAND gate 5121 acts as an inverter, and DLL clock CLK_P is delayed at delay circuit 5124 and inverted by inverter 5127 to be output to node N1. Delay circuit 5125, inverter 5128 and NAND gate 5122 output to node N2 a falling pulse corresponding to the delay time by delay circuit 5125, synchronized with the rising edge of the signal at node N1, thereby resulting in signal /CLKF_P. NAND gate 5123 then receives signal /CLKF_P and a signal produced by delaying signal /CLKF_P at delay circuit 5126 and outputs a signal being at H level from the falling edge of signal /CLKF_P to the rising edge of the delayed signal of signal /CLKF_P. The signal output from NAND gate 5123 is then inverted by inverter 5129, thereby resulting in signal /CLK_PE.

/CLK_NE generation circuit 514 includes NAND gates 5141–5143, delay circuits 5144–5146 and inverters 5147–5149. /CLK_NE generation circuit 514 generates falling pulse signals /CLKF_N and /CLK_NE from DLL clock CLK_N when internal signal DOE is at H level, similar to /CLK_PE generation circuit 512. The circuit configuration of /CLK_NE generation circuit 514 is same as that of /CLK_PE generation circuit 512 and therefore description thereof will not be repeated.

Referring to FIG. 19, CLKO generation circuit 516 includes an NAND gate 5161 and inverters 5162–5167. CLKO generation circuit 516 generates DLL clock CLKO and DLL clock /CLKO complementary thereto synchronized with the falling pulse signals /CLKF_P and /CLKF_N respectively generated at /CLK_PE generation circuit 512 and /CLK_NE generation circuit 514.

CQP generation circuit 518 includes a three-input NAND gate 5181, two-input NAND gates 5182 and 5183 and an inverter 5184.

CQP generation circuit 518 generates control clock CQP based on signals /CLK_NE and /CLK_PE when internal signal DOE is at H level. Control clock CQP goes to H level in response to the rise of signal /CLK_PE when signal /CLK_NE is at H level, and thereafter goes to L level in response to the fall of signal /CLK_NE.

In the following, the operation of CQP generation circuit 518 will be described.

In the following description, assuming that internal signal DOE is always at H level, first, signals /CLK_NE and /CLK_PE are respectively at H and L levels. At this point, the output node of NAND gate 5182 is at H level, the output node of NAND gate 5181 is at L level, and the output node of NAND gate 5183 is at H level. Therefore control clock CQP is at L level. In this state, when signal /CLK_PE goes to H level, the output node of NAND gate 5183 goes to L level and control clock CQP goes to H level. Here, the state of the output nodes of NAND gates 5181 and 5182 remains unchanged with the changed state of control signal /CLK_PE, and control clock CQP is held at H level.

Next, in this state, when signal /CLK_NE goes to L level, the output node of NAND gate 5181 goes to H level and the output node of NAND gate 5182 goes to L level. Then, the output node of NAND gate 5183 is inverted to H level and control clock CQP goes to L level.

Thereafter, even if signal /CLK_NE goes to H level again, the state of the output node of each NAND gate remains unchanged and control clock CQP is held at L level. Thereafter when signal /CLK_PE goes to L level, the output node of NAND gate 5182 is at H level and the output node of NAND gate 5181 is at L level. As signal /CLK_PE is at L level, however, the output node of NAND gate 5183 is at H level and therefore control clock CQP remains at L level.

CQN generation circuit 520 includes a three-input NAND gate 5201, two-input NAND gates 5202 and 5203 and an inverter 5204.

CQN generation circuit 520 generates control clock CQN based on signals /CLK_PE and /CLK_NE when internal signal DOE is at H level. Control clock CQN goes to H level in response to the rise of signal /CLK_NE when signal /CLK_PE is at H level, and thereafter goes to L level in response to the fall of signal /CLK_PE. The configuration of CQN generation circuit 520 is same as that of CQP generation circuit 518 except that control signals /CLK_PE and /CLK_NE change places. Therefore description thereof will not be repeated.

FIG. 20 is a timing chart collectively showing operation timings of control signals /CLK_PE and /CLK_NE, control clocks CQP and CQN and DLL clock CLKO generated in clock generation circuit 510.

Referring to FIG. 20, DLL clocks CLK_P and CLK_N are respectively shifted backward by time Ta from the rising/falling edges of external clock EXTCLK. Clock generation circuit 510 brings signal /CLK_PE to L level in response to the rising edge of DLL clock CLK_P (reference character ①) and at the same time generates DLL clock CLKO that is a pulse signal (reference character ②). Clock generation circuit 510 then generates control clock CQP going to H level in response to the rise of signal /CLK_PE (reference character ③), and brings control clock CQP to L level in response to the fall of signal /CLK_NE (reference character ④).

It should be noted that DLL clock CLKO is a pulse signal included while signal /CLK_PE is at L level and that control clock CQP is a signal generated correspondingly when signal /CLK_PE goes to H level. More specifically, clock generation circuit 510 generates each signal such that control clock CQP for shifting internal signal QSOE does not overlap with DLL clock CLKO that determines the output timing of data strobe signal DQS generated based on signals QSOE1 and QSOE2 generated by shifting internal signal QSOE. In this manner, clock generation circuit 510 matches the shift timing of signal in the inside of the device to the output timing of signal to the outside of the device. This is applicable to the relation between control clock CQN and DLL clock CLKO.

Note that time Ta has to satisfy Ta>Tb+Tc, where Tb represents the propagation time for the read data to be taken into amplifier circuits 362 and 364 and then to reach output data latch circuit 302 in data output circuit 200, and Tc represents the time for data DQ to be output from output data latch circuit 302 to the outside through output driver circuit 304.

FIGS. 21–23 are circuit diagrams showing the configuration of QSOE shift circuit 502 operating in synchronization with control clock CQP generated in clock generation circuit 510.

Referring to FIGS. 21–23, QSOE shift circuit 502 includes an internal circuit 533 including a CQND generation circuit 530 and a CQPD generation circuit 532, a shift circuit 534, and a signal generation circuit 536.

Referring to FIG. 21, CQND generation circuit 530 includes an NAND gate 5302 and an inverter 5304 and generates signals CQND and /CQND by taking in control clock CQN when internal signal DOE is at H level.

CQND generation circuit 532 includes an NAND gate 5322 and an inverter 5324, and similar to CQND generation circuit 530, generates signals CQPD and /CQPD by taking in control clock CQP when internal signal DOE is at H level.

Referring to FIG. 22, shift circuit 534 includes transfer gates 5341–5344 and an inverter 5345.

Transfer gate 5341 includes inverters 5346 and 5348 and an NAND gate 5347. Transfer gate 5342 includes inverters 5349 and 5351 and an NAND gate 5350. Transfer gate 5343 includes inverters 5352 and 5354 and an NAND gate 5353. Transfer gate 5344 includes inverters 5355 and 5357 and an NAND gate 5356.

In shift circuit 534, alternately arranged are transfer gates 5341 and 5343 outputting the signal at the input node to the output node when control clock CQN is at H level and transfer gates 5342 and 5344 outputting the signal at the input node to the output node when control clock CQP is at H level. Signals QSOED0–QSOED3 are generated by shifting internal signal QSOE sequentially, in response to control clocks CQP and CQN as alternately received.

In the following, the specific operation of shift circuit 534 will be described.

In the following, it is assumed that internal signal DOE is always at H level. After internal signal QSOE is output from READ control circuit 400, CQND circuit 530 receives control clock CQN and signal CQND goes to H level (signal /CQND is at L level). Then, inverter 5346 in transfer gate 5341 on the first stage is activated. Inverter 5345 inverts signal QSOE, and inverter 5346 takes in and inverts the inverted signal to output signal QSOED0. At the output node of NAND gate 5347, the inverted signal of signal QSOED0 is output. Note that while signal CQND is at H level, inverter 5348 is inactivated.

When signal CQND goes to L level (signal /CQND is at H level), inverter 5346 is inactivated, inverter 5348 is activated, and inverter 5348 and NAND gate 5347 form a latch. Therefore, the state of signal QSOED0 and at the output node NAND gate 5347 is held. Thereafter, when signal CQPD goes to H level (signal /CQPD is at L level), inverter 5349 is activated at transfer gate 5342 on the second stage. Inverter 5349 inverts the signal output from transfer gate 5341 to output signal QSOED1. At the output node of NAND gate 5350, the inverted signal of signal QSOED1 is output. Note that while signal CQPD is at H level, inverter 5351 is inactivated.

When signal CQPD goes to L level (signal /CQPD is at H level), inverter 5349 is inactivated, inverter 5351 is activated, and inverter 5351 and NAND gate 5350 form a latch. Therefore, the state of signal QSOED1 and at the output node of NAND gate 5350 is held.

Thereafter, also in transfer gates 5343 and 5344, a signal transition takes place in response to control clocks CQN and CQP, and signals QSOED2 and QSOED3 are sequentially output respectively from transfer gates 5343 and 5344. Note that the circuit configurations and performance of transfer gates 5343 and 5344 are same as those of transfer gates 5341 and 5342, respectively. Therefore, descriptions thereof will not be repeated.

In this manner, shift circuit 534 generates signals QSOED0–QSOED3 by sequentially shifting internal signal QSOE output from READ control circuit 400, in synchronization with control clocks CQN and CQP.

Referring to FIG. 23, signal generation circuit 536 includes NOR gates 5361–5365, NAND gates 5366 and 5367, AND gates 5368–5371 and inverters 5372–5375.

Signal generation circuit 536 uses signals QSOED0–QSOED3 formed by sequentially shifting internal signal QSOE and generates signal QSOE1 for determining the preamble period depending on CAS latency (here either 2.0 or 2.5) and signal QSOE2 for determining the period in which a transition of data strobe signal DQS takes place in synchronization with data DQ.

In the following, the signals in signal generation circuit 536 will be described.

A signal OEA20 is at H level from H level of signal QSOED0 input to NOR gate 5361 to L level of signal QSOED2 input to NOR gate 5362.

A signal OEB20 is at H level from H level of signal QSOED1 input to NOR gate 5362 to L level of signal QSOED2 input to NOR gate 5362.

A signal OEA25 is at H level from H level of signal QSOED1 input to NOR gate 5362 to L level of signal QSOED3 input to NOR gate 5363.

A signal OEB25 is at H level from H level of signal QSOED2 input to NOR gate 5363 to L level of signal QSOED3 input to NOR gate 5363.

Here, a signal MCL20 input to AND gates 5368 and 5370 is at H level when CAS latency is 2.0. On the other hand, a signal MCL 25 input to AND gates 5369 and 5371 is at H level when CAS latency is 2.5.

Therefore, when CAS latency is 2.0, signal QSOE1 is formed by signal OEA20 and signal QSOE2 is formed by signal OEB20. On the other hand, when CAS latency is 2.5, signal QSOE1 is formed by signal OEA25 and signal QSOE2 is formed by signal OEB25. The specific signal waveforms of signals QSOE1 and 2 corresponding to internal signal QSOE will be illustrated later with respect to an overall timing chart (when CAS latency CL is 2.5) for each signal in data strobe signal output circuit 500.

FIG. 24 is a circuit diagram showing the configuration of output data generation circuit 504.

Referring to FIG. 24, output data generation circuit 504 includes inverters 5041–5045 and NAND gates 5046–5053.

Output data generation circuit 504 generates signals RDA and /RDA that are original signals for data strobe signal DQS, in synchronization with control clocks CQP and CQN.

Here, since the starting point for data strobe signal DQS is determined depending on CAS latency, it is necessary to select either of control clocks CQP and CQN as a starting point for signals RDA and /RDA depending on CAS latency and to generate signals RDA and /RDA using the selected control clock as a starting point. More specifically, when CAS latency is an integer, control clock CQN should be the starting point, and when CAS latency is a half-integer, control clock CQP should be the starting point. In output data generation circuit 504, the circuit on the stage prior to NAND gate 5050 selects a trigger to generate signals RDA and /RDA either from control clocks CQP or CQN depending on CAS latency.

On the other hand, the circuit on the stage following NAND gate 5051 generates signals RDA and /RDA based on signals QSOE1 and 2 depending on the control clock selected in the circuit on the prior stage.

In the following, the operation of output data generation circuit 504 will be described.

It is assumed that CAS latency is 2.5. When control clock CQP is input, the output node of inverter 5041 goes to L level, whereby the output nodes of NAND gates 5046, 5048 and 5050 go to H level, L level and H level, respectively. Since the output node of NAND gate 5047 is at L level, the state at the output node of NAND gate 5046 is held even if control clock CQP goes to L level after that. Therefore the state at the output node of NAND gates 5048 and 5050 is also held.

Next, when control clock CQN is input, the output node of NAND gate 5047 goes to H level, the output node of NAND gate 5046 goes to L level, and the output node of NAND gate 5048 goes to H level. Here, signal MCL20 input to NAND gate 5049 is always at L level when CAS latency is 2.5, so that the output node of NAND gate 5049 is always at H level. Therefore, the output node of NAND gate 5050 goes from H level to L level.

In this manner, when CAS latency is 2.5, the output node of NAND gate 5050 goes to H level in response to control clock CQP and goes to L level in response to control clock CQN. Similarly, when CAS latency is 2.0, the output node of NAND gate 5050 goes to H level in response to control clock CQN and goes to L level in response to control clock CQP.

In the circuit on the following stages, both NAND gates 5052 and 5053 receive signal QSOE1. When signal QSOE1 is at L level, both signals RDA and /RDA go to L level. When signal QSOE1 is at H level (as shown in a timing chart later, signal QSOE1 goes to H level half cycle before preamble period and is held at H level until the start of postamble period), the signal output from NAND gate 5051 is output as signal RDA through inverter 5043, NAND gate 5052 and inverter 5044 and is also output as signal /RDA through NAND gate 5053 and inverter 5045.

NAND gate 5051 inverts the signal output from NAND gate 5050 when signal QSOE2 is at H level. Therefore, the signal output from NAND gate 5050 is output from output data generation circuit 504 as signal RDA and signal /RDA that is the inverted signal RDA when both signals QSOE1 and 2 are at H level. The waveforms of signals RDA and /RDA will be described later with respect to an overall timing chart (when CAS latency is 2.5) for each signal in data strobe signal output circuit 500.

FIG. 25 is a circuit diagram showing the configuration of output data latch circuit 506.

Referring to FIG. 25, output data latch circuit 506 includes an RES generation circuit 540, a /RDH latch circuit 542 and a /RDL latch circuit 544.

RES generation circuit 540 includes an NOR gate 5402, an inverter 5404 and an NAND gate 5406. /RDH latch circuit 542 includes a clocked inverter 5422 receiving DLL clocks CLKO and /CLKO as clock inputs and signal RDA as an input signal, an NOR gate 5424, and a clocked inverter 5426 operating by receiving a clock input having a phase opposite to clocked inverter 5422. /RDL latch circuit 544 includes a clocked inverter 5442 receiving DLL clocks CLKO and /CLKO as clock inputs and signal /RDA as an input signal, an NOR gate 5444, and a clocked inverter 5446 operating by receiving a clock input having a phase opposite to clocked inverter 5442.

RES generation circuit 540 outputs signal RES at L level when either of signals /RDH and /RDL respectively generated by /RDH latch circuit 542 and /RDL latch circuit 544 goes to H level. More specifically, when either of signals /RDH and /RDL goes to H level, NOR gate 5402 outputs a signal at L level, which is inverted at inverter 5404 and NAND gate 5406, thereby resulting in signal RES at L level. Then, as described later, when signal RES is at L level, signals /RDH and /RDL are latched at /RDH latch circuit 542 and /RDL latch circuit 544, respectively.

/RDH latch circuit 542 inverts signal RDA to be output as signal /RDH to the output node when it receives DLL clock CLKO (DLL clocks CLKO and /CLKO are respectively at H level and L level). Then, when DLL clocks CLKO and /CLKO are inverted, clocked inverter 5442 is inactivated while clocked inverter 5426 is activated. Furthermore, since signals /RDH and /RDL are complementary to each other and signal RES is at L level when signals RDA and /RDA are output from output data generation circuit 504, signal /RDH is latched by NAND gate 5424 and clocked inverter 5426.

Also in /RDL latch circuit 544, signal /RDL is latched in a manner similar to /RDH latch circuit 542. It is noted that the configuration of /RDL latch circuit 544 is same as that of /RDH latch circuit 542 and therefore the description thereof will not be repeated.

In this manner, output data latch circuit 506 latches signals RDA and /RDA output from output data generation circuit 504 by DLL clock CLKO and using DLL clock CLKO as a trigger, also outputs signals /RDH and /RDL to output driver circuit 508.

FIG. 26 is a circuit diagram showing the configuration of output driver circuit 508.

Referring to FIG. 26, output driver circuit 508 includes a P channel MOS transistor 5081, an N channel MOS transistor 5082 and inverters 5083–5085.

When both signals /RDH and /RDL are at H level, the input gates of P channel MOS transistor 5081 and N channel MOS transistor 5082 are respectively at H level and L level, so that the output node has high impedance.

When signals /RDH and /RDL are respectively at H level and L level, the input gates of P channel MOS transistor 5081 and N channel MOS transistor 5082 are respectively at H level and H level, so that the output node is at L level.

When signals /RDH and /RDL are respectively at L level and H level, the input gates of P channel MOS transistor 5081 and N channel MOS transistor 5082 are respectively at L level and L level, so that the output node is at H level.

FIG. 27 is a timing chart illustrating the waveforms of representative signals in data strobe signal output circuit 500 described above.

Referring to FIG. 27, in this timing chart, READ command is read at timing T1 and data DQ starts to be output at timing T6, 2.5 cycles after timing T1. That is, the case where CAS latency is 2.5 is shown.

DLL clock CLK_P is generated shifted backward by time Ta from the rising edge of external clock EXTCLK. DLL clock CLK_N is generated shifted backward by time Ta from the falling edge of external clock EXTCLK.

Signal /CLK_PE falls in response DLL clock CLK_P rising and has a prescribed falling width. Signal /CLK_NE falls in response to DLL clock CLK_N rising and has a prescribed falling width.

Control clock CQP rises in response to signal /CLK_PE rising and falls in response to signal /CLK_NE falling. Control clock CQN rises in response to signal /CLK_NE rising and falls in response to signal /CLK_PE falling.

DLL clock CLKO rises in response to DLL clock CLK_P rising and has half a cycle having a prescribed pulse width. Here, DLL clock CLKO is characterized in that it is generated such that the pulse width is included within the falling range of signals /CLK_PE, /CLK_NE and does not overlap with control clocks CQP, CQN.

Internal signal QSOE received from READ control circuit 400 goes to H level during (burst length BL/2) cycle after receiving READ command at timing T1. Here, burst length BL is set at four and internal signal QSOE goes to L level at timing T5. Signal QSOE1 goes to H level (in the vicinity of timing T3) in response to the next control clock CQP after internal signal QSOE goes to H level, and goes to L level (in the vicinity of timing T9) in response to control clock CQP after (burst length BL/2+1). Signal QSOE2 goes to H level (in the vicinity of timing T4) in response to control clock CQN following control clock CQP that is the starting point of signal QSOE1, and goes to L level (in the vicinity of timing T9) concurrently with signal QSOE1.

Signal RDA may be output when signal QSOE1 is at H level. Signal RDA is at L level when signal QSOE2 is at L level and when signal QSOE2 goes to H level, it repeats rising and falling from the next control clock CQP in synchronization with the rising edges of control clocks CQP and CQN (from the vicinity of timing T5 to the vicinity of timing T9). It is noted that signal RDA is at L level when signal QSOE1 is at L level.

Similar to signal RDA, signal /RDA may be output when signal QSOE1 is at H level and it is complementary to signal RDA while signal QSOE1 is at H level. It is noted that signal /RDA is at L level when signal QSOE1 is at L level.

Signals /RDH and /RDL operate in synchronization with DLL clock CLKO whereas the signals described above operate in synchronization with control clocks CQP and CQN. Signal /RDH is an inverted signal of signal RDA and signal /RDL is an inverted signal of signal /RDA, both of which are synchronized with DLL clock CLKO.

Then, data strobe signal DQS as a final output goes to L level during the preamble period before data DQ starts to be output, as shown, in response to signals /RDH and /RDL, repeats inversion in synchronization with external clock EXTCLK (backward amount Ta of DLL clocks CLK_P, CLK_N is adjusted in such a manner), and goes to L level during the postamble period (timings T4–T10).

As shown in FIG. 13, since DLL clocks CLK_P and CLK_N are supplied at a variety of points, as much as a few mA of current is consumed by charge/discharge of parasitic capacitance on the signal line, the operations of circuits receiving DLL clock and the like. During a data reading operation, the proportion of the current associated with DLL clock to the entire current is low. However, during so-called active-standby in which rows are activated and the column operation is not performed, the entire current is about 20 mA and thus the proportion of the current associated with DLL clock to the entire current is very high.

Here, it is possible to reduce the current associated with DLL clock described above by activating the circuit on the output stage of DLL circuit 100 at the time of receiving READ command and by prohibiting the output of internal clocks CLK_PF and CLK_NF at the time except the data reading operation.

However, since the time from reception of READ command to the actual distribution of DLL clock to each circuit is constant, it is difficult to stably supply DLL clock before data output is started, in case where CAS latency is short or where the operation frequency is high. More particularly, as described above, data strobe signal DQS needs to be provided with a preamble period one cycle before data output, and data strobe signal output circuit 500 needs to be supplied with DLL clock at the earlier stage.

In addition, READ control circuit 400 may sometimes use the internal clock to determine the timing at which the data read from the memory cell array is taken to the data bus pair and may require an internal clock corresponding to the next cycle after receiving READ command. Therefore, READ control circuit 400 also needs to be supplied with an internal clock at the earlier stage.

SUMMARY OF THE INVENTION

The present invention is therefore made to solve these problems. An object of the present invention is to provide a semiconductor memory device which allows for lower power consumption during active-standby by appropriately distributing an internal clock for each circuit on the chip.

Another object of the present invention is to provide a semiconductor memory device which allows for lower power consumption during active-standby by appropriately distributing an internal clock for each circuit on the chip and which allows the internal clock to be securely supplied to a prescribed circuit during a data reading operation.

In accordance with the present invention, a semiconductor memory device is provided in which data is input/output in synchronization with a rise and a fall of an external clock. The semiconductor memory device includes: a memory cell array storing data; an internal clock generation circuit generating first and second internal clocks respectively corresponding to the rise and the fall of the external clock in synchronization with the external clock; at least one operation clock output circuit receiving the first and second internal clocks to output the first and second internal clocks respectively as first and second operation clocks in response to an output enabling signal enabling output of the first and second internal clocks; and at least one data output circuit receiving the first and second operation clocks to externally output data read from the memory cell array in synchronization with the first and second operation clocks.

Preferably, the semiconductor memory device further includes at least one signal recovering circuit arranged on a signal path between the internal clock generation circuit and the data output circuit and for recovering a signal level output from the internal clock generation circuit. Each at least one operation clock generation circuit is provided corresponding to each at least one signal recovering circuit and is included in each at least one signal recovering circuit.

Preferably, the semiconductor memory device further includes a data strobe signal output circuit receiving the first and second internal clocks and the first and second operation clocks and generating and externally outputting a data strobe signal indicative of a timing at which the read data is externally output from the data output circuit, based on the first and second internal clocks and the first and second operation clocks. The data strobe signal output circuit includes a signal generation circuit generating the data strobe signal based on the first and second internal clocks and a signal output circuit externally outputting the data strobe signal generated by the signal generation circuit, in synchronization with the first and second operation clocks.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a schematic block diagram showing an overall configuration of a semiconductor memory device in accordance with the present invention.

FIG. 2 is a schematic block diagram conceptually illustrating the overall configuration of an READ-related circuitry in the semiconductor memory device in accordance with a first embodiment.

DESCRIPTION OF THE PREFERRED EMBODIMENTS

Figure 3:
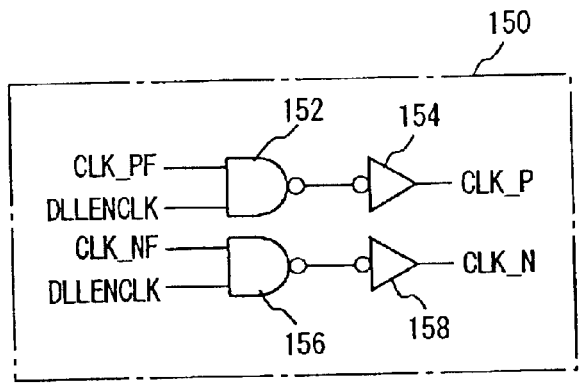
FIG. 3 is a circuit diagram showing a configuration of the repeater shown in FIG. 2.

In the following, embodiments of the present invention will be described in detail with reference to the figures. It is noted that in the figures the same or corresponding parts will be denoted with the same reference characters and therefore description thereof will not be repeated.

[First Embodiment]

FIG. 1 is a schematic block diagram showing the overall configuration of a semiconductor memory device 10 in accordance with a first embodiment of the present invention.

Referring to FIG. 1, semiconductor memory device 10 includes a clock terminal 12, a control signal terminal 14, an address terminal 16, a data input/output terminal 18 and a data strobe signal input/output terminal 20.

Semiconductor memory device 10 further includes a clock buffer 22, a control signal buffer 24, an address buffer 26, an input buffer 28 and an output buffer 30 for data DQ0–DQ15, and an input buffer 32 and an output buffer 34 for data strobe signals UDQS and LDQS.

Semiconductor memory device 10 further includes a read amplifier & P/S (Parallel/Serial) conversion circuit 36, an S/P (Serial/Parallel) conversion circuit & write driver 38, a DQS generation circuit 40 and a DLL circuit 100.

Semiconductor memory device 10 also includes a control circuit 42, a row decoder 44, a column decoder 46, a preamplifier & write amplifier 48, a sense amplifier 50 and a memory cell array 52.

Note that in FIG. 1, only the main part for data input/output in semiconductor memory device 10 is representatively shown.

Semiconductor memory device 10 has a two-bit prefetch configuration in which data of 2×n bits (where n is a bit width in a semiconductor memory device and n=16 in semiconductor memory device 10) is read in a single readout. More specifically, data of two bits is read from memory cell array 52 to each of n data output circuits every one cycle. Data of two bits is then ordered at each of data output circuits and transferred to be output to the outside every half cycle.

In writing data, semiconductor memory device 10 takes in data of n bits (n=16) every half cycle in synchronization with the rise and fall of the data strobe signal and writes data corresponding to two half cycles into memory cell array 52 every one cycle.

Clock terminal 12 receives an external clock EXTCLK, an external clock EXT/CLK complementary thereto and a clock enable signal CKE. Control signal terminal 14 receives command control signals of a chip select signal /CS, a row address strobe signal /RAS, a column address strobe signal /CAS, a write enable signal /WE and input/output DQ mask signals UDM and LDM. Address terminal 16 receives address signals A0–A12 and bank address signals BA0 and BA1.

Clock buffer 22 receives external clocks EXTCLK and EXT/CLK and clock enable signal CKE to generate and output an internal clock to control signal buffer 24, address buffer 26 and DLL circuit 100. Control signal buffer 24, in synchronization with the internal clock received from clock buffer 22, takes in chip select signal /CS, row address strobe signal /RAS, column address strobe signal /CAS, write enable signal /WE and input/output DQ mask signals UDM and LDM to be latched and outputs the command control signal to control circuit 42. Address buffer 26, in synchronization with the internal clock received from clock buffer 22, takes in address signals A0–A12 and bank address signals BA0 and BA1 to be latched and generates and outputs an internal address signal to row decoder 44 and column decoder 46.

Data input/output terminal 18 communicates data to be read and written in semiconductor memory device 10 with the outside of the device. It receives data DQ0–DQ15 input from the outside in writing data and outputs data DQ0–DQ15 to the outside in reading data. Data strobe signal input/output terminal 20 externally receives data strobe signals UDQS and LDQS for externally reading data DQ0–DQ15 in writing data and outputs data strobe signals UDQS and LDQS for an external controller to read data DQ0–DQ15 in reading data.

Input buffer 28 inputs data DQ0–DQ15 in synchronization with data strobe signals UDQS and LDQS externally received by input buffer 32.

Output buffer 30 operates in synchronization with DLL clock generated based on the internal clock generated in DLL circuit 100, and outputs data DQ0–DQ15 to data input/output terminal 18 every half cycle. Output buffer 34 operates in synchronization with DLL clock along with output buffer 30 outputting data DQ0–DQ15, and outputs data strobe signals UDQS and LDQS generated by DQS generation circuit 40 to data strobe signal input/output terminal 20.

In reading data, read amplifier & P/S conversion circuit 36 amplifies read data received from preamplifier & write amplifier 48 and orders data of two bits read at one time each as data DQi (i:0–15) to be output to output buffer 30. In writing data, S/P conversion circuit & write driver 38 outputs each data DQi received from input buffer 28 bit by bit every half cycle to preamplifier & write amplifier 48 by two bits in parallel every one cycle.

Control circuit 42 takes in the command control signal in synchronization with DLL clock described above and controls row decoder 44, column decoder 46 and preamplifier & write amplifier 48 based on the taken-in command control signal. Accordingly, data DQ0–DQ15 is read from and written into memory cell array 52. Furthermore, control circuit 42 also controls generation of the data strobe signal in DQS generation circuit 40 based on the taken-in command control signal.

Memory cell array 52 storing data is formed of four banks each capable of operating independently, to and from which data is written and read through sense amplifier 50.

DLL circuit 100 outputs internal clocks CLK_PF and CLK_NF generated by delaying external clock EXTCLK.

Internal clocks CLK_PF and CLK_NF output from DLL circuit 100 have the signal level maintained by a repeater (not shown in FIG. 1) and is ultimately input as DLL clock to output buffers 30 and 34, read amplifier & P/S conversion circuit 36, DQS generation circuit 40 and control circuit 42.

FIG. 2 is a schematic block diagram conceptually illustrating the overall configuration of the READ-related circuitry in semiconductor memory device 10 in accordance with the first embodiment of the present invention.

Referring to FIG. 2, DLL circuit 100 outputs internal clock CLK_PF generated by delaying external clock EXTCLK and internal clock CLK_NF generated by delaying external clock EXT/CLK.

Repeater 150 receives internal clocks CLK_PF and CLK_NF output from DLL circuit 100 and outputs internal clocks CLK_PF and CLK_NF respectively as DLL clocks CLK_P and CLK_N when internal signal DLLENCLK received from READ control circuit 400 is at H level.

A plurality of data output circuits 200 are provided based on a word organization to which this semiconductor memory device corresponds. Here, sixteen data output circuits 200 are provided for outputting data DQ0–DQ15. Each of data output circuits 200 receives DLL clocks CLK_P and CLK_N output from repeater 150, is activated by either DLL clock CLK_P or CLK_N selected according to internal signal NZPCNT received from READ control circuit 400, and takes in and externally outputs data read out from the memory cell array onto the data bus.

Here, as shown in FIG. 2, a signal path from DLL circuit 100 to data output circuit 200 is generally formed like a tree. Each circuit and signal line is arranged such that data output timings do not vary among a plurality of data output circuits 200. Generally, one repeater 150 is arranged for eight data output circuits or four data output circuits.

Data strobe signal output circuit 300 generates and externally outputs data strobe signals LDQS and UDQS which indicate of timing for externally outputting the read data output from data output circuit 200. Data strobe signal output circuit 300 receives internal clocks CLK_PF and CLK_NF output from DLL circuit 100 and DLL clocks CLK_P and CLK_N output from repeater 150, generates data strobe signals LDQS and UDQS during the period from preamble to postamble using internal signal QSOE received from READ control circuit 400 in synchronization with internal clocks CLK_PF and CLK_NF, and externally outputs the generated data strobe signals LDQS and UDQS in synchronization with DLL clocks CLK_P and CLK_N.

READ control circuit 400 operates in synchronization with internal clocks CLK_PF and CLK_NF received from DLL circuit 100 and generates a variety of signals necessary for a data reading operation in response to READ command, and outputs these signals to data output circuit 200 and data strobe signal output circuit 300.

The difference between semiconductor memory device 10 in the first embodiment and the conventional technique will now be described.

Semiconductor memory device 10 in accordance with the first embodiment differs from the conventional technique in that internal signal DLLENCLK is used for activating repeater 150 and in that internal clocks CLK_PF and CLK_NF output from DLL circuit 100 as well as DLL clocks CLK_P and CLK_N output from repeater 150 are input into data strobe signal output circuit 300.

In the conventional technique, internal clocks CLK_PF and CLK_NF output from DLL circuit 100 are always supplied to data output circuit 200 and data strobe signal output circuit 500 through repeater 120. Therefore, DLL clock is unnecessarily supplied even when data is not read, resulting in undesirable power consumption.

On the contrary, in the first embodiment, repeater 150 is activated when internal signal DLLENCLK is at H level. DLL clocks CLK_P and CLK_N are output from repeater 150 to data output circuit 200 only in this limited time period.

Here, internal signal DLLENCLK is at H level from reception of READ command to completion of outputting data DQ and is generated in READ control circuit 400. More specifically, internal signal DLLENCLK is at H level at least for (CAS latency CL+burst length BL/2) cycles after receiving READ command. Internal signal DLLENCLK, in some case, may have an H level of which duration is extended by an adequate time period after data output is completed.

Meanwhile, internal clocks CLK_PF and CLK_NF are distributed from DLL circuit 100 to data strobe signal output circuit 300 and READ control circuit 400. DLL circuit 100 outputs internal clocks CLK_PF and CLK_NF at least irrespective of READ command but generally depending on the state of ACT command (an external input command activating rows) or external signal EXTCKE (a signal allowing external clocks EXTCLK and EXT/CLK to be received).

Because of such a configuration, DLL clocks CLK_P and CLK_N will not be output from repeater 150 at the time of active-standby, so that a component after repeater 150 of the current consumed in association with DLL clocks is cut down, thereby reducing the current at the time of active-standby. In addition, irrespective of READ command, data strobe signal output circuit 300 and READ control circuit 400 are supplied with internal clocks CLK_PF and CLK_NF, so that data strobe signal output circuit 300 and READ control circuit 400 can perform a prescribed operation stably using internal clocks CLK_PF and CLK_NF immediately after receiving READ command.

In the first embodiment, data strobe signal output circuit 300 also receives DLL clocks CLK_P and CLK_N output from repeater 150. This is because the phase difference between data DQ output by data output circuit 200 and data strobe signal DQS output by data strobe signal output circuit 300 has to be within time tDQSQ. Therefore, data strobe signal output circuit 300 also takes in DLL clocks CLK_P and CLK_N determining an operation timing for data output circuit 200, and externally outputs data strobe signal DQS generated in synchronization with internal clocks CLK_PF and CLK_NF, in synchronization with DLL clocks CLK_P and CLK_N.

In this manner, both data DQ output from data output circuit 200 and data strobe signal DQS output from data strobe signal output circuit 300 are output to the outside in synchronization with DLL clocks CLK_P and CLK_N, so that the phase difference between data DQ and data strobe signal DQS is controlled within tDQSQ.

It is noted that repeater 150 receiving internal signal DLLENCLK as well as DLL circuit 100, data output circuit 200 and READ control circuit 400 except data strobe signal output circuit 300 receiving internal clocks CLK_PF and CLK_NF do not differ from the conventional technique and have already been described with reference to the conventional technique. Therefore description thereof will not be repeated.

FIG. 3 is a circuit diagram showing the configuration of repeater 150.

Referring to FIG. 3, repeater 150 includes NAND gates 152 and 156 and inverters 154 and 158. NAND gate 152 receives internal clock CLK_PF output from DLL circuit 100 and internal signal DLLENCLK output from READ control circuit 400. Inverter 154 inverts the output from NAND gate 152 for outputting as DLL clock CLK_P. NAND gate 156 receives internal clock CLK_NF output from DLL circuit 100 and internal signal DLLENCLK output from READ control circuit 400. Inverter 158 inverts the output from NAND gate 154 for outputting as DLL clock CLK_N.

In this manner, repeater 150 outputs internal clock CLK_PF as DLL clock CLK_P and also outputs internal clock CLK_NF as DLL clock CLK_N only when internal signal DLLENCLK is at H level.

Figure 4:
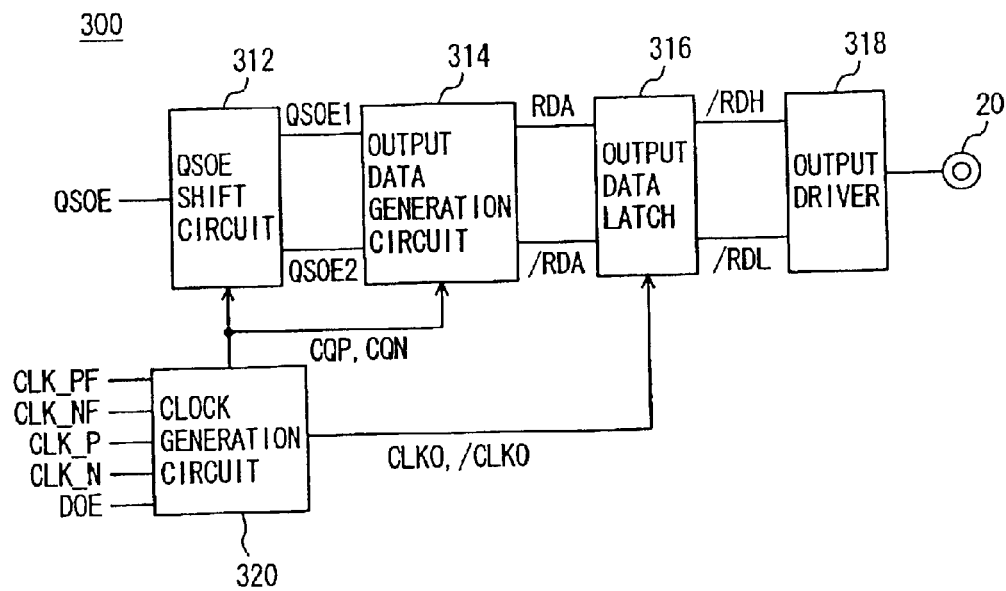
FIG. 4 is a functional block diagram illustrating the data strobe signal output circuit shown in FIG. 2.

FIG. 4 is a functional block diagram illustrating data strobe signal output circuit 300. Although in FIG. 2, two data strobe signals LDQS and UDQS respectively corresponding to the lower bit and the upper bit of the output data DQ are output from data strobe signal output circuit 300 and separate circuits are provided for outputting these two signals, only a circuit corresponding to either one of the signals is shown in FIG. 4 as their circuit configurations are same.

Referring to FIG. 4, data strobe signal output circuit 300 includes a QSOE shift circuit 312, an output data generation circuit 314, an output data latch circuit 316, an output driver circuit 318 and a clock generation circuit 320.

Clock generation circuit 320 receives internal clocks CLK_PF and CLK_NF output from DLL circuit 100 and DLL clocks CLK_P and CLK_N output from repeater 150 and further receives internal signal DOE output from READ control circuit 400 and generates control clocks CQP and CQN activating QSOE shift circuit 312 and output data generation circuit 314 as well as DLL clocks CLKO and /CLKO activating output data latch circuit 316. Here, internal signal DOE is at H level during the READ operation period.

QSOE shift circuit 312 receives internal signal QSOE output from READ control circuit 400 and generates signals QSOE1 and QSOE2 by shifting internal signal QSOE by a prescribed amount in synchronization with control clocks CQP and CQN output from clock generation circuit 320.

Here, internal signal QSOE is a signal for determining a column activation period based on burst length BL and goes to H level for (burst length BL/2) cycles after receiving READ command. Furthermore, the generated signal QSOEL is a signal for determining the preamble period and signal QSOE2 is a signal for determining a time period during which a transition of data strobe signal DQS takes place in synchronization with data DQ.

Output data generation circuit 314, in synchronization with control clocks CQP and CQN output from clock generation circuit 320, generates data RDA and /RDA for generating data strobe signal DQS from the start of the preamble period to the end of the postamble period based on signals QSOE1 and QSOE2 output from QSOE shift circuit 312.

Output data latch circuit 316 and output driver circuit 318 operate every half cycle in synchronization with DLL clocks CLKO and /CLKO output from clock generation circuit 320.

Control clocks CQP and CQN used in QSOE shift circuit 312 and output data generation circuit 314 are generated in clock generation circuit 320 based on internal clocks CLK_PF and CLK_NF. Since internal clocks CLK_PF and CLK_NF are output at DLL circuit 100 at least irrespective of READ command, data strobe signal output circuit 300 can stably generate signals QSOE1 and QSOE2 and signals RDA and /RDA after receiving READ command.

On the other hand, DLL clocks CLKO and /CLKO determining an output timing of data strobe signal DQS are generated in clock generation circuit 320 based on DLL clocks CLK_P and CLK_N. Therefore, data strobe signal DQS is output to the outside, ideally without any phase difference with respect to data DQ output from data output circuit 200.

In the following, the configuration of clock generation circuit 320 generating control clocks CQP and CQN and DLL clocks CLKO and /CLKO will be described. It is noted that the configurations of QSOE shift circuit 312, output data generation circuit 314, output data latch circuit 316 and output driver circuit 318 do not differ from those of the conventional technique and have already been described with respect to the conventional technique. Therefore description thereof will not be repeated.

Figure 5:
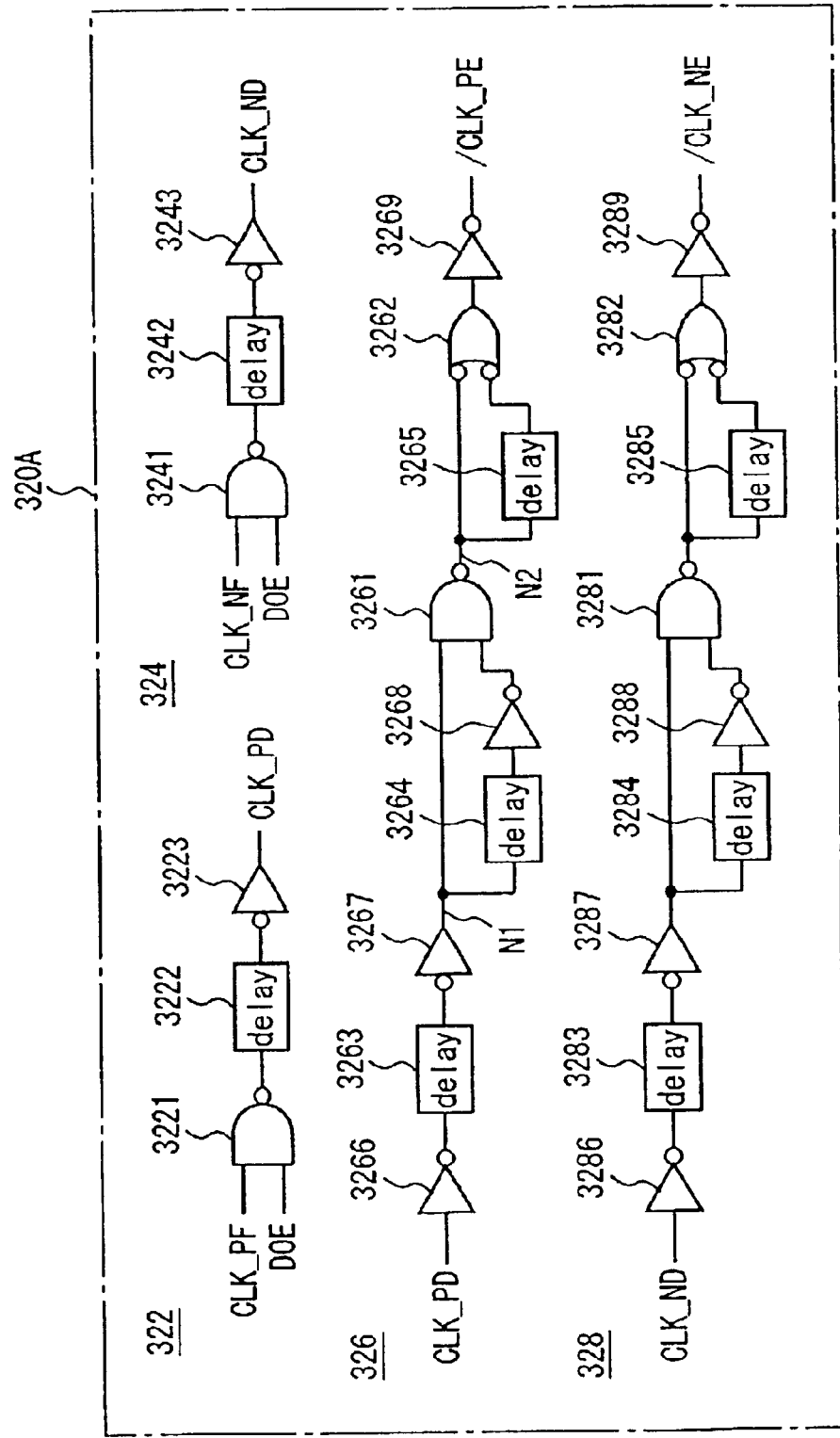
FIG. 5 is a first circuit diagram showing a configuration of the clock generation circuit shown in FIG. 4.
Figure 6:
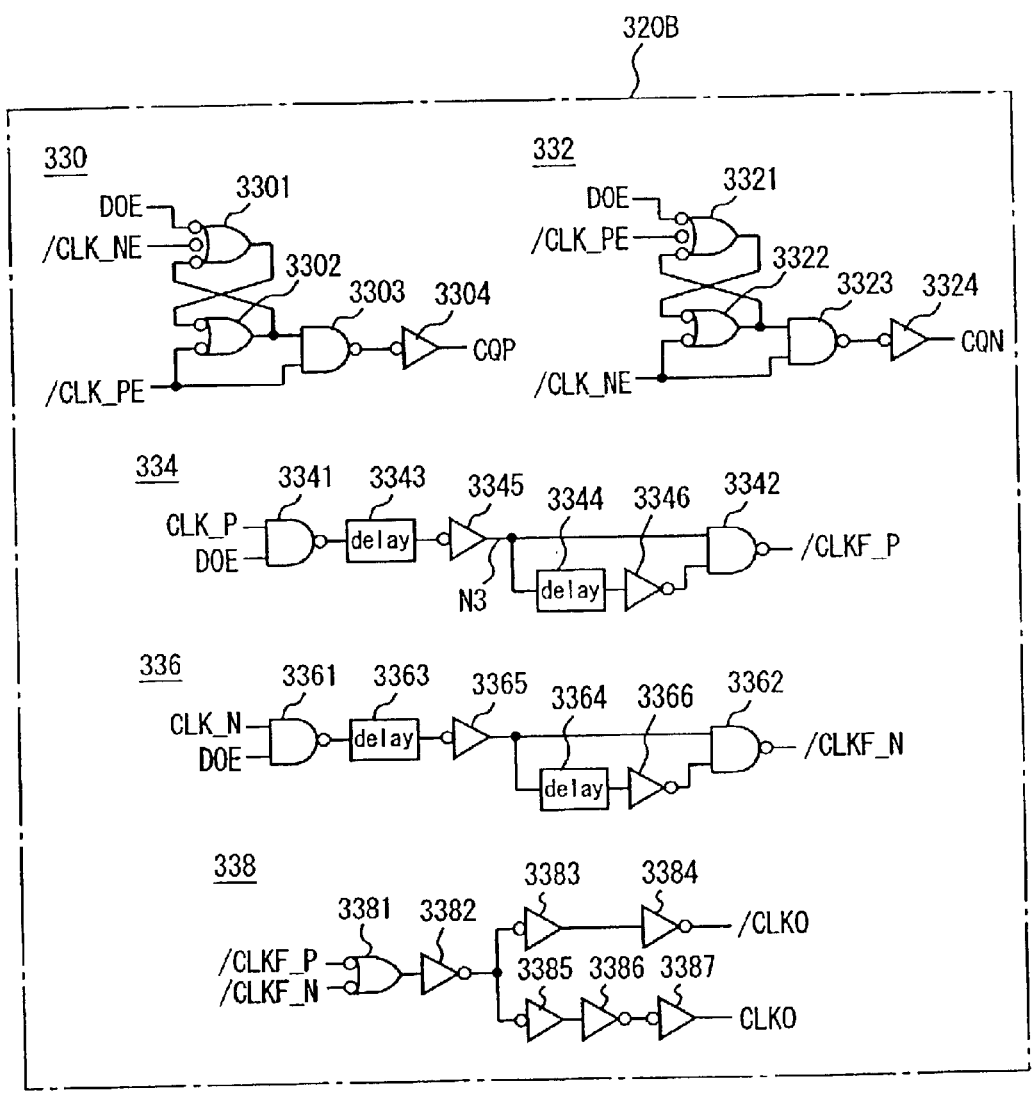
FIG. 6 is a second circuit diagram showing the configuration of the clock generation circuit shown in FIG. 4.

FIGS. 5 and 6 are circuit diagrams showing the configuration of clock generation circuit 320.

Referring to FIGS. 5 and 6, clock generation circuit 320 includes a first internal circuit 320A and a second internal circuit 320B. First internal circuit 320A includes a CLK_PD generation circuit 322, a CLK_ND generation circuit 324, a /CLK_PE generation circuit 326 and a /CLK_NE generation circuit 328. Second internal circuit 320B includes a CQP generation circuit 330, a CQN generation circuit 332, a /CLKF_P generation circuit 334, a /CLKF_N generation circuit 336 and a CLKO generation circuit 338.

Referring to FIG. 5, CLK_PD generation circuit 322 includes an NAND gate 3221 receiving internal clock CLK_PF and internal signal DOE, a delay circuit 3222, and an inverter 3223. CLK_PD generation circuit 322 outputs an internal clock CLK_PD produced by delaying internal clock CLK_PF at delay circuit 3222 when internal signal DOE is at H level.

CLK_ND generation circuit 324 includes an NAND gate 3241 receiving internal clock CLK_NF and internal signal DOE, a delay circuit 3242 and an inverter 3243. CLK_ND generation circuit 324 outputs an internal clock CLK_ND produced by delaying internal clock CLK_NF at delay circuit 3242 when internal signal DOE is at H level.

/CLK_PE generation circuit 326 includes NAND gates 3261 and 3262, delay circuits 3263–3265 and inverters 3266–3269. /CLK_PE generation circuit 326, in synchronization with the rising edge of internal clock CLK_PD, generates signal /CLK_PE having a falling width corresponding to a time period added by delay time of delay circuits 3265 and 3266.

In the following, the operation of /CLK_PE generation 326 will be described briefly.

Delay circuit 3263 delays and outputs a signal produced by inverting internal clock CLK_PD at inverter 3266, which inverter 5127 inverts and outputs to node N1. The circuitry formed with delay circuit 3264, inverter 3268 and NAND gate 3261 is responsive to the rising edge of the signal at node N1 to generate a falling pulse signal having a pulse width corresponding to the delay time of delay circuit 3264 and to output the same to node N2. The circuitry formed with delay circuit 3265 and NAND gate 3262 generates a signal having a pulse width of the falling pulse signal output from node N2, added by the delay time of delay circuit 3265. The signal output from NAND gate 3262 is then inverted by inverter 3269, thereby resulting in signal /CLK_PE.

/CLK_NE generation circuit 328 includes NAND gates 3281 and 3282, delay circuits 3283–3285, and inverters 3286–3289.

The configuration of /CLK_NE generation circuit 328 is same as that of /CLK PE generation circuit 326 and therefore description thereof will not be repeated.

Similar to /CLK_PE generation circuit 326, when internal signal DOE is at H level, /CLK_NE generation circuit 328 delays internal clock CLK_ND at delay circuit 3283 and generates signal /CLK_NE having a falling width corresponding to the delay time of delay circuits 3284 and 3285.

Referring to FIG. 6, CQP generation circuit 330 includes a three-input NAND gate 3301, two-input NAND gates 3302 and 3303 and an inverter 3304.

CQP generation circuit 330 generates control clock CQP based on signals /CLK_NE and /CLK_PE when internal signal DOE is at H level. Control clock CQP goes to H level in response to signal /CLK_PE rising when signal /CLK_NE is at H level, and thereafter goes to L level in response to signal /CLK_NE falling.

In the following, the operation of CQP generation circuit 330 will be described briefly.

In the following description, assuming that internal signal DOE is always at H level, first, signals /CLK_NE and /CLK_PE are respectively at H level and L level. At this point, the output nodes of NAND gates 3302, 3301 and 3303 are respectively at H level, L level and H level, and therefore control clock CQP is at L level. In this state, when signal /CLK_PE goes to H level, the output node of NAND gate 3303 goes to L level and control clock CQP goes to H level. At this point, the state at the output nodes of NAND gates 3301 and 3302 remains unchanged with the changed state of control signal /CLK_PE, and control clock CQP is held at H level.

Then, in this state, when signal /CLK_NE goes to L level, the output nodes of NAND gates 3301 and 3302 go to H level and L level, respectively. Then, the output node of NAND gate 3303 is inverted to H level and control clock CQP goes to L level.

Thereafter, even when signal /CLK_NE goes to H level again, the state at the output node of each NAND gate remains unchanged and control clock CQP is held at L level. After that, when main signal /CLK_PE goes to L level, the output node of NAND gate 3302 goes to H level and the output node of NAND gate 3301 goes to L level. However, as signal /CLK_PE is at L level, the output node of NAND gate 3303 is at H level and therefore control clock CQP remains at L level.

CQN generation circuit 332 includes a three-input NAND gate 3321, two-input NAND gates 3322 and 3323, and an inverter 3324.

CQN generation circuit 332 generates control clock CQN based on signals /CLK_PE and /CLK_NE when internal signal DOE is at H level. Control clock CQN goes to H level in response to signal /CLK_NE rising when signal /CLK_PE is at H level, and thereafter goes to L level in response to signal /CLK_PE falling. The configuration of CQN generation circuit 332 is same as that of CQP generation circuit 330 except that control signals /CLK_PE and /CLK_NE change places. Therefore description thereof will not be repeated.

/CLKF_P generation circuit 334 includes NAND gates 3341 and 3342, delay circuits 3343 and 3344 and inverters 3345 and 3346.

/CLKF_P generation circuit 334 generates a falling pulse signal /CLKF_P delayed by the delay time of delay circuit 3343 with respect to DLL clock CLK_P and having a pulse width corresponding to the delay time of delay circuit 3344.

In the following, the operation of /CLKF_P generation circuit 334 will be described briefly.

When internal signal DOE is at H level, NAND gate 3341 inverts DLL clock CLK_P for output. Delay circuit 3343 delays the signal output from NAND gate 3341 for output. Inverter 3345 inverts that signal to be output to node N3. The circuitry formed with delay circuit 3344, inverter 3346 and NAND gate 3342 generates falling pulse signal /CLKF_P having a pulse width corresponding to the delay time at delay circuit 3344 in response to the rising edge of the signal at node N3.

/CLKF_N generation circuit 336 includes NAND gates 3361 and 3362, delay circuits 3363 and 3364, and inverters 3365 and 3366. Similar to /CLKF_P generation circuit 334, /CLKF_N generation circuit 336 generates a falling pulse signal /CLKF_N delayed by the delay time of delay circuit 3363 with respect to DLL clock CLK_N and having a pulse width corresponding to the delay time of delay circuit 3364. The configuration of /CLKF_N generation circuit 336 is same as that of /CLKF_P generation circuit 334 and therefore description thereof will not be repeated.

CLKO generation circuit 338 includes an NAND gate 3381 and inverters 3382–3387. CLKO generation circuit 338 generates DLL clock CLKO and complimentary DLL clock /CLKO synchronized with falling pulse signals /CLKF_P and /CLKF_N respectively generated in /CLKF_P generation circuit 334 and /CLKF_N generation circuit 336.

When generating control clocks CQP and CQN, clock generation circuit 320 in accordance with the first embodiment delays internal clocks CLK_PF and CLK_NF output from DLL circuit 100 by a prescribed amount and generates control clocks CQP and CQN based on the delayed internal clocks CLK_PD and CLK_ND.

The reason is as follows. Internal clocks CLK_PF, CLK_NF and DLL clocks CLK_P, CLK_N are taken in respectively before and after repeater 150 and have a skew to each other. As mentioned in the description of the conventional technique, control clocks CQP, CQN used in generating data strobe signal DQS in QSOE shift circuit 312 and output data generation circuit 314 and DLL clocks CLKO, /CLKO used in outputting data strobe signal DQS in output data latch circuit 316 and output driver circuit 318 should not have a period with H level overlapped. Therefore, internal clocks CLK_PD, CLK_ND are generated by delaying by an adequate amount internal clocks CLK_PF, CLK_NF rising relatively earlier and based on these control clocks CQP, CQN are generated, so that control clocks CQP, CQN do not overlap with DLL clock CLKO generated based on DLL clocks CLK_P, CLK_N.

As described above, in accordance with semiconductor memory device 10 of the first embodiment, DLL clocks CLK_P and CLK_N are output from repeater 150 only in a data reading operation, so that components after repeater 150 of the current consumed by distribution of DLL clocks CLK_P and CLK_N is cut down during active-standby, thereby reducing power consumption.

Furthermore, data strobe signal output circuit 300 and READ control circuit 400 are supplied with internal clocks CLK_PF and CLK_NF output from DLL circuit 100 irrespective of READ command and in addition data strobe signal output circuit 300 is further supplied with DLL clocks CLK_P and CLK_N, so that in data strobe signal output circuit 300 and READ control circuit 400, a prescribed operation is stably performed using internal clocks CLK_PF and CLK_NF immediately after receiving READ command. In addition, in data strobe signal output circuit 300, data strobe signal DQS can be output to the outside using DLL clocks CLK_P and CLK_N, thereby attaining synchronization with data DQ output from data output circuit 200.

(Second Embodiment)

Returning to FIG. 2, in the READ-related circuitry in accordance with the first embodiment, DLL clocks CLK_P and CLK_N input into data strobe signal output circuit 300 is supplied from repeater 150 positioned closest to data strobe signal output circuit 300. Here, as a route to supply DLL clock to data strobe signal output circuit 300, a signal line connected to data output circuit 200 positioned closest to data strobe signal output circuit 300 may be branched to connect to data strobe signal output circuit 300. Alternatively, a signal line may be branched immediately after repeater 150 to connect to data strobe signal output circuit 300. In the latter case, the skew of DLL clocks CLK_P and CLK_N between data output circuits 200 can be made small.

On the other hand, since the load capacity in view of each repeater 150 varies between repeater 150 outputting DLL clocks CLK_P and CLK_N to data strobe signal output circuit 300 and repeater 150 without outputting, the skew of data DQ between data output circuits 200 connected to the respective repeaters may be deteriorated.

Therefore, semiconductor memory device in accordance with the second embodiment includes a repeater with a delay element having an adjustable delay amount in order to minimize the skew caused for the aforementioned reason.

Figure 7:
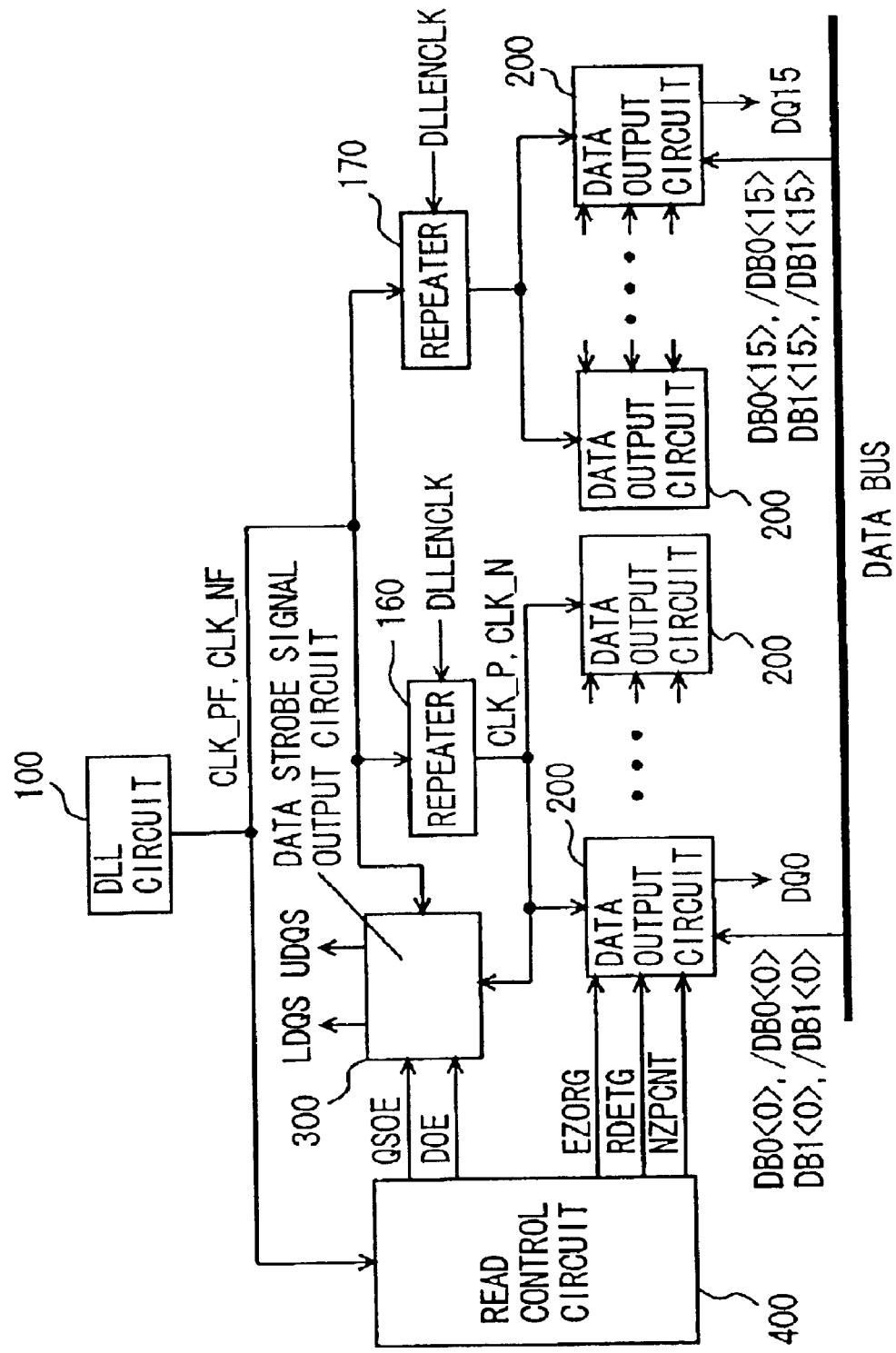
FIG. 7 is a schematic block diagram conceptually illustrating a overall configuration of the READ-related circuitry in the semiconductor memory device in accordance with a second embodiment.

FIG. 7 is a schematic block diagram conceptually illustrating the overall configuration of the READ-related circuitry in semiconductor memory device 10A in accordance with the second embodiment of the present invention.

Referring to FIG. 7, the READ-related circuitry in semiconductor memory device 10A includes repeaters 160 and 170 in place of repeater 150 in the READ-related circuitry in semiconductor memory device 10 shown in FIG. 2. The remaining DLL circuit 100, data output circuit 200, data strobe signal output circuit 300 and READ control circuit 400 are same as those in the READ-related circuitry in semiconductor memory device 10. Therefore description thereof will not be repeated.

Repeaters 160 and 170 include delay elements delaying an input signal to be output The delay amount of repeater 160 supplying DLL clocks CLK_P and CLK_N to data output circuit 200 and also to data strobe signal output circuit 300 is set at a small value relative to that in the delay amount of repeater 170 supplying DLL clocks CLK_P and CLK_N only to data output circuit 200.

Figure 8:
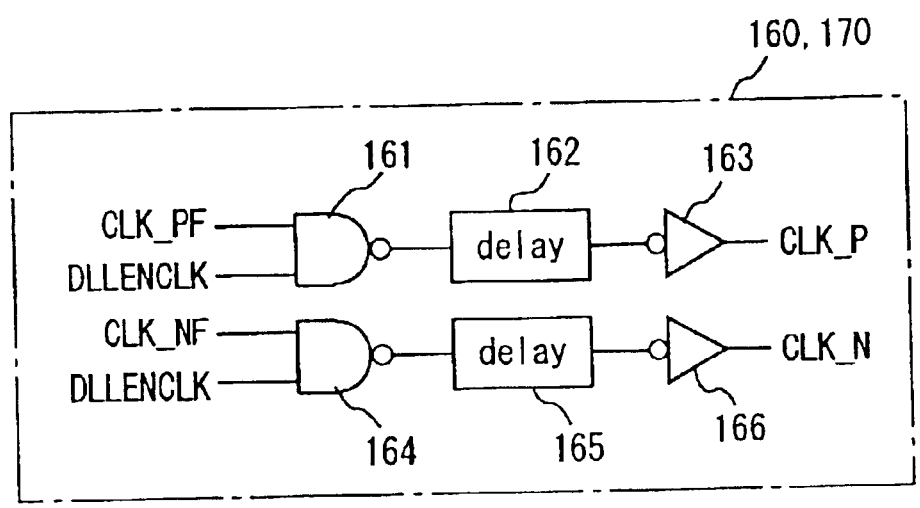
FIG. 8 is a circuit diagram showing a configuration of the repeater shown in FIG. 7.

FIG. 8 is a circuit diagram showing the configuration of repeaters 160 and 170. Repeaters 160 and 170 have the same circuit configuration. The delay amount of the delay element included in each circuit is relatively adjusted.

Referring to FIG. 8, each of repeaters 160 and 170 includes NAND gates 161 and 164, delay elements 162 and 165, and inverters 163 and 166. NAND gate 161 receives internal clock CLK_PF output from DLL circuit 100 and internal signal DLLENCLK output from READ control circuit 400. Delay element 162 receives the output from NAND gate 161 and delays the same by a prescribed amount for output. Inverter 163 inverts the output from delay element 162 for outputting as DLL clock CLK_P.

NAND gate 164 receives internal clock CLK_NF output from DLL circuit 100 and internal signal DLLENCLK output from READ control circuit 400. Delay element 165 receives the output from NAND gate 164 and delays the same by a prescribed amount for output. Inverter 166 inverts the output from delay element 165 for outputting as DLL clock CLK_N.

As described above, in accordance with semiconductor memory device 10A of the second embodiment, only when internal signal DLLENCLK is at H level, DLL clocks CLK_P and CLK_N are output, and repeaters 160 and 170 including the delay elements are provided, so that power consumption can be reduced, as in the first embodiment. In addition, the delay amount of the delay element provided in repeaters 160, 170 is adjusted, so that it is possible to reduce the skew between data DQ output from data output circuit 200 under repeater 160 supplying DLL clock also to data strobe signal output circuit 300 and data DQ output from data output circuit 200 under repeater 170 supplying DLL clock only to data output circuit 200.

(Third Embodiment)

In a third embodiment, a buffer is provided at the bottom of the signal interconnection for the DLL circuit, the repeater and the data output circuit formed like a tree. This buffer is provided with a function similar to that of repeater 150 in the first embodiment.

Figure 9:
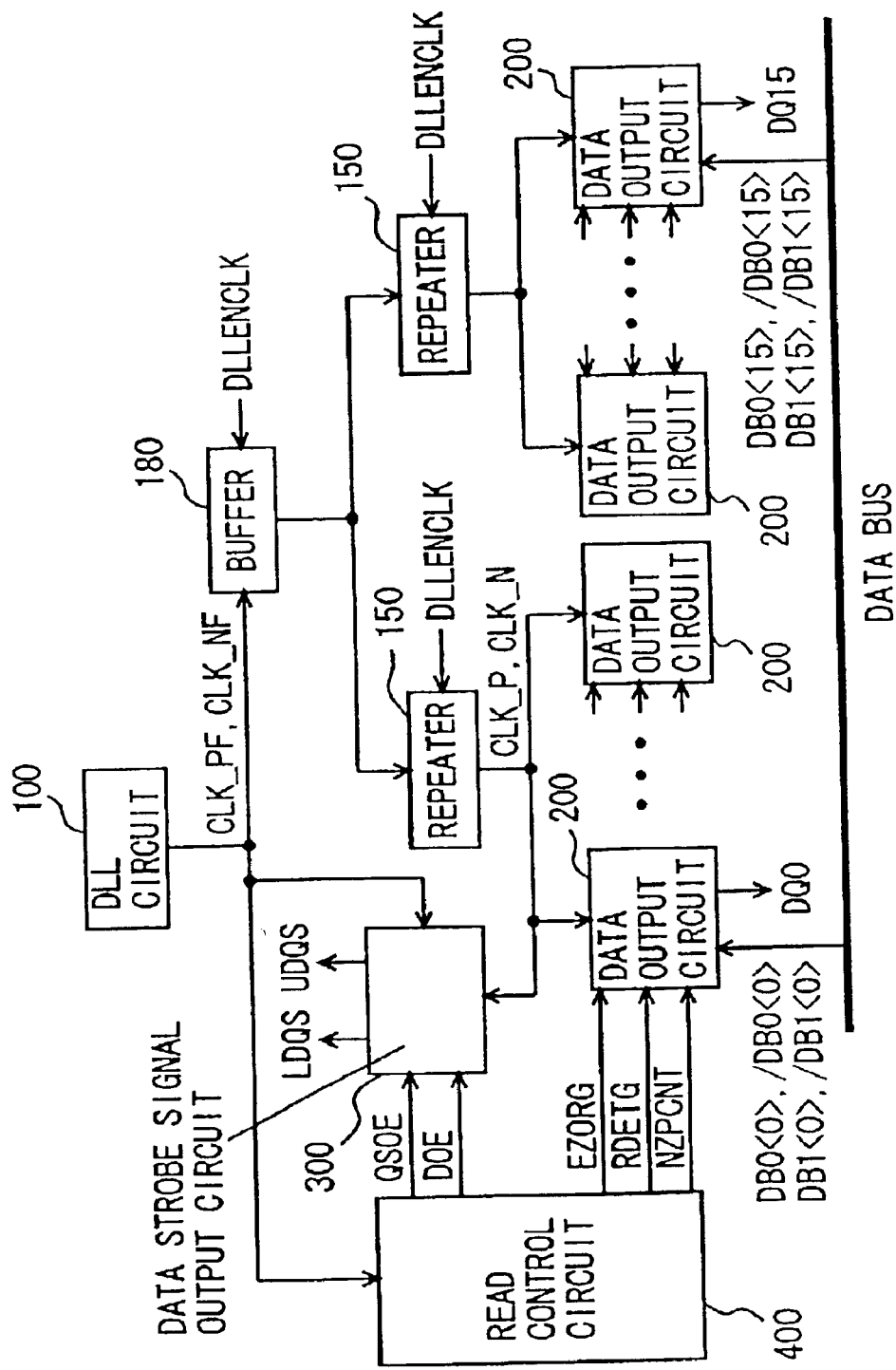
FIG. 9 is a schematic block diagram conceptually illustrating a overall configuration of the READ-related circuitry in the semiconductor memory device in accordance with a third embodiment.

FIG. 9 is a schematic block diagram conceptually illustrating the overall configuration of the READ-related circuitry in semiconductor memory device 10B in accordance with the third embodiment of the present invention.

Referring to FIG. 9, in the READ-related circuitry in semiconductor memory device 10B, a buffer 180 is further provided in the READ-related circuitry in semiconductor memory device 10 shown in FIG. 2.

Buffer 180 receives internal clocks CLK_PF and CLK_NF distributed from DLL circuit 100 and outputs to repeater 150 internal clocks CLK_PF and CLK_NF respectively as DLL clocks CLK_PB and CLK_NB when internal signal DLLENCLK received from READ control circuit 400 is at H level.

The remaining DLL circuit 100, repeater 150, data output circuit 200, data strobe signal output circuit 300 and READ control circuit 400 are same as those in the READ-related circuitry in semiconductor memory device 10 and description thereof will not be repeated.

In the READ-related circuitry in semiconductor memory device 10B, DLL clocks CLK_PB and CLK_NB are not supplied to wiring and circuit following buffer 180 during active-standby. Therefore, that component after buffer 180 of the current consumed in distributing DLL clock is cut down, thereby reducing the current during active-standby. Then, as compared with the first embodiment, the current is further reduced by the amount corresponding to the wiring between buffer 180 and repeater 150.

In addition, also in the third embodiment, as in the first embodiment, in order to realize a stable operation immediately after receiving READ command in data strobe signal output circuit 300 and READ control circuit 400, data strobe signal output circuit 300 and READ control circuit 400 are supplied with internal clocks CLK_PF and CLK_NF irrespective of a data reading operation.

In addition, in order to limit the phase difference within tDQSQ between data strobe signal DQS output by data strobe signal output circuit 300 and data DQ output by data output circuit 200, as in the first embodiment, data strobe signal output circuit 300 also receives DLL clocks CLK_P and CLK_N output from repeater 150 and externally outputs the generated data strobe signal DQS in synchronization with DLL clocks CLK_P and CLK_N.

The circuit configuration of buffer 180 is same as that of repeater 150 shown in FIG. 3. Therefore, description of the internal circuit configuration will not be repeated.

It is noted that although repeater 150 is shown to have the function of enabling/disenabling the output of DLL clock using internal signal DLLENCLK, the repeater in the third embodiment may not have the function of effecting the output of DLL clock in response to internal signal DLLENCLK, since such a function is provided in buffer 180 upstream from repeater 150 in the third embodiment.

Furthermore, in case a plurality of repeaters are provided, repeaters 160 and 170 described in the second embodiment may be used in place of repeater 150 in order to reduce the skew, which is caused between data DQ output from data output circuits 200 connected to each of the repeaters by the difference of load capacity between the repeaters as DLL clocks CLK_P and CLK_N are supplied from one repeater to data strobe signal output circuit 300.

As describe above, in accordance with semiconductor memory device 10B of the third embodiment, buffer 180 is provided between DLL circuit 100 and repeater 150 and DLL clock is output from buffer 180 only when internal signal DLLENCLK is at H level, so that power consumption during active-standby is reduced, as in the first and second embodiments. In addition, the power consumption can be further reduced as the length of wiring is shortened for internal clocks CLK_PF and CLK_NF distributed irrespective of a data reading operation.

(Fourth Embodiment)

In a fourth embodiment, at the output stage of the DLL circuit generated are internal clocks CLK_PF, CLK_NF distributed irrespective of the data reading operation and DLL clocks CLK_PL, CLK_NL distributed only at the time of the data reading operation. Internal clocks CLK_PF and CLK_NF are output to the data strobe signal output circuit and the READ control circuit. DLL clocks CLK_PL and CLK_NL are output to the repeater. DLL clocks CLK_PL and CLK_NL are then output as DLL clocks CLK_P and CLK_N through the repeater to the data output circuit and the data strobe signal output circuit.

Figure 10:
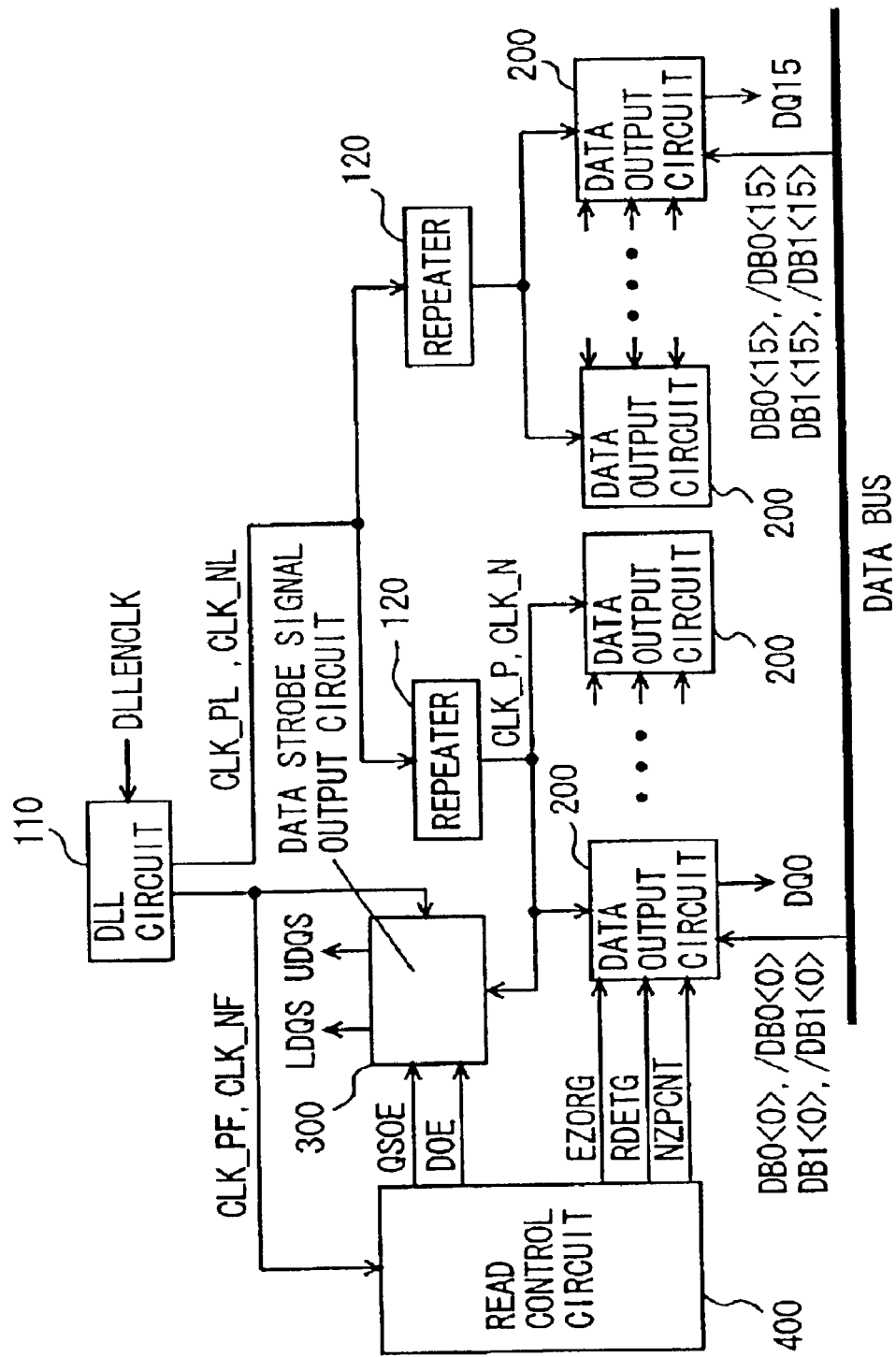
FIG. 10 is a schematic block diagram conceptually illustrating a overall configuration of the READ-related circuitry in the semiconductor memory device in accordance with a fourth embodiment of the present invention.

FIG. 10 is a schematic block diagram conceptually illustrating the overall configuration of the READ-related circuitry in semiconductor memory device 10C in accordance with the fourth embodiment of the present invention.

Referring to FIG. 10, in the READ-related circuitry in semiconductor memory device 10C, a DLL circuit 110 is provided in place of DLL circuit 100 in the READ-related circuitry in semiconductor memory device 10 shown in FIG. 2.

DLL circuit 110 generates internal clocks CLK_PF, CLK_NF output irrespective of the data reading operation and DLL clocks CLK_PL, CLK_NL output when internal signal DLLENCLK received from READ control circuit 400 is at H level. DLL circuit 110 then supplies internal clocks CLK_PF and CLK_NF to data strobe signal output circuit 300 and READ control circuit 400 and supplies DLL clocks CLK_PL and CLK_NL to repeater 120.

Figure 15:
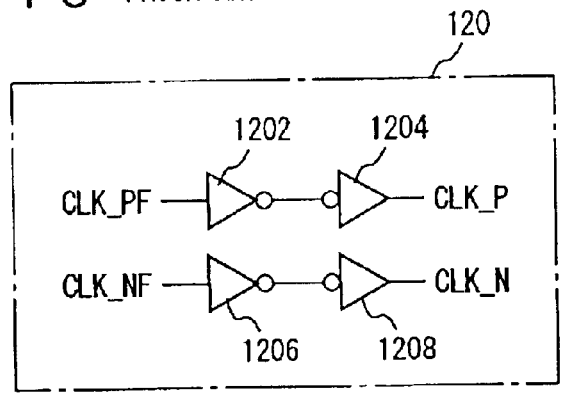
FIG. 15 is a circuit diagram showing a configuration of the repeater in FIG. 13.
Figure 16:
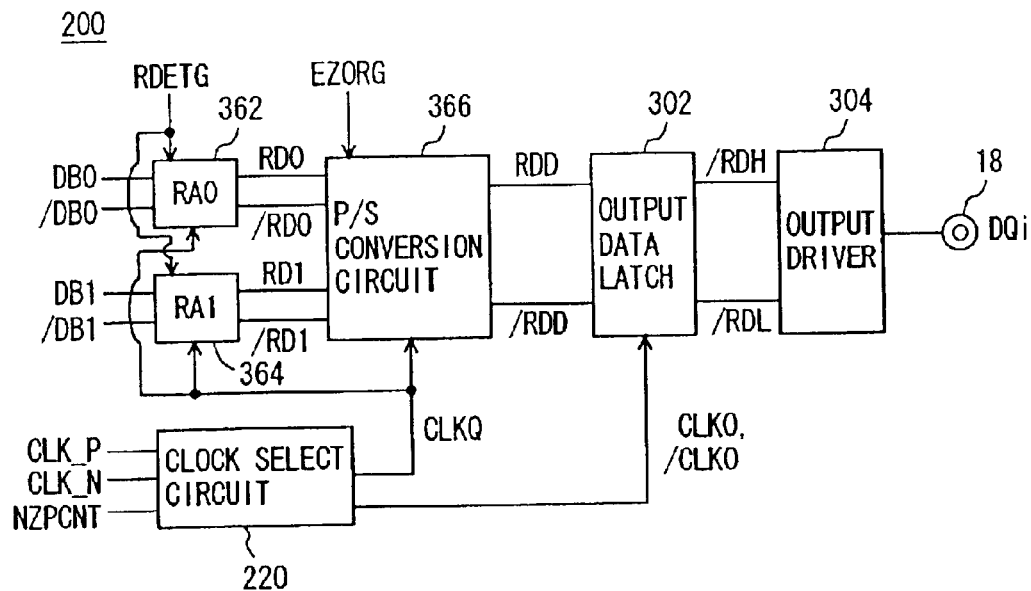
FIG. 16 is a functional block diagram illustrating the data output circuit shown in FIG. 13.
Figure 17:
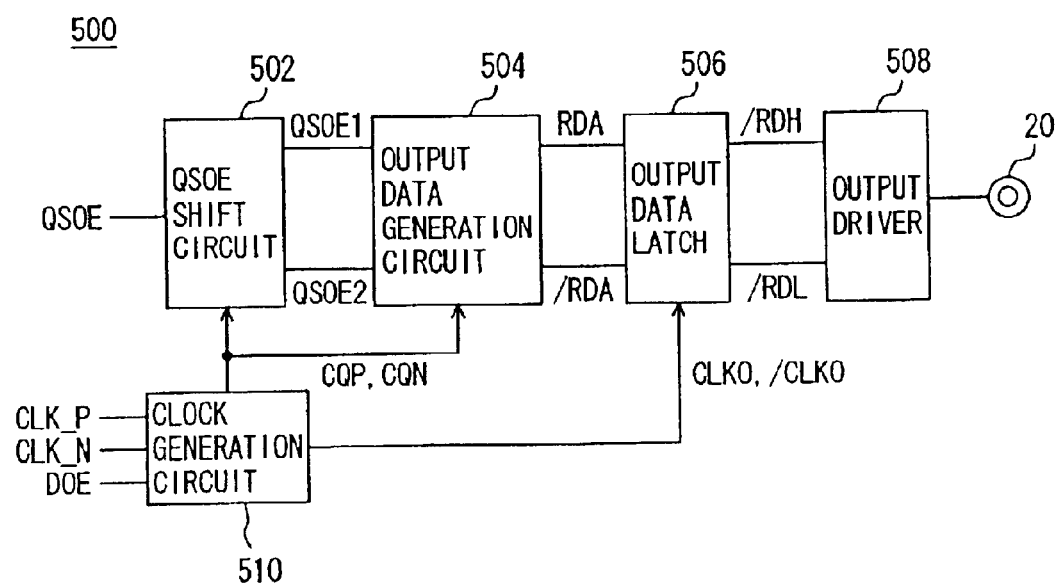
FIG. 17 is a functional block diagram illustrating the data strobe signal output circuit shown in FIG. 13.
Figure 18:
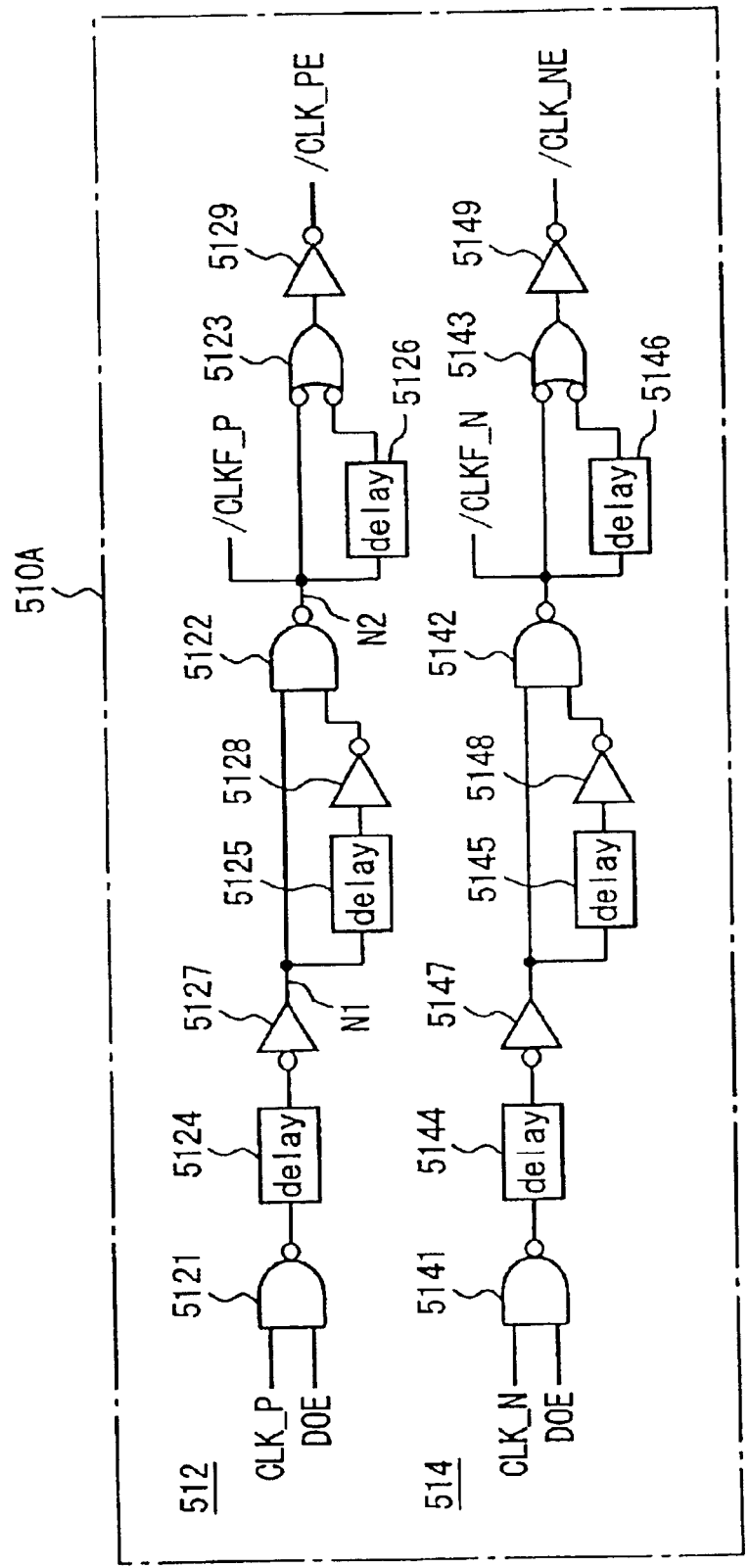
FIG. 18 is a first circuit diagram showing a configuration of the clock generation circuit shown in FIG. 17.
Figure 19:
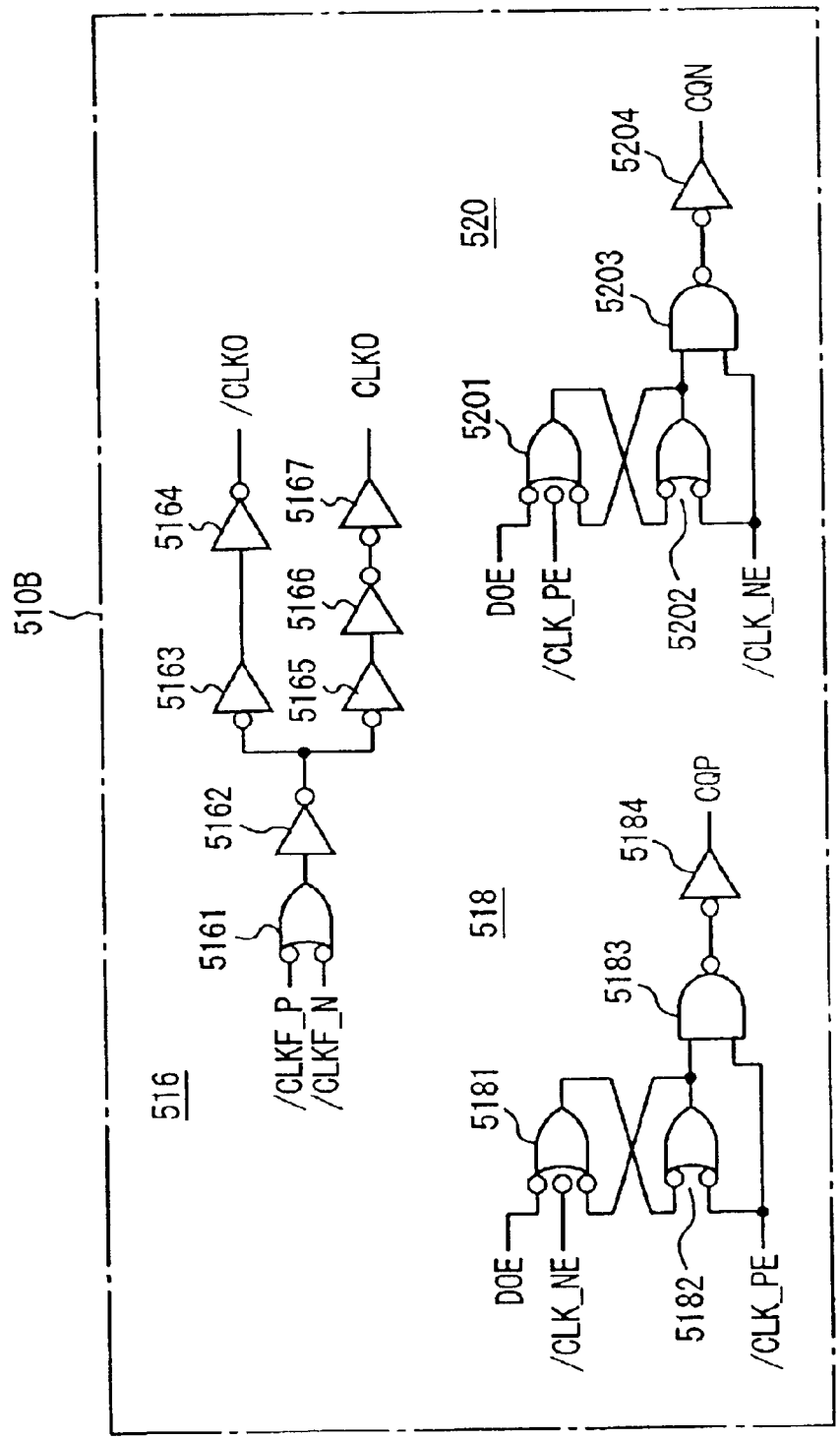
FIG. 19 is a second circuit diagram showing the configuration of the clock generation circuit shown in FIG. 17.
Figure 20:
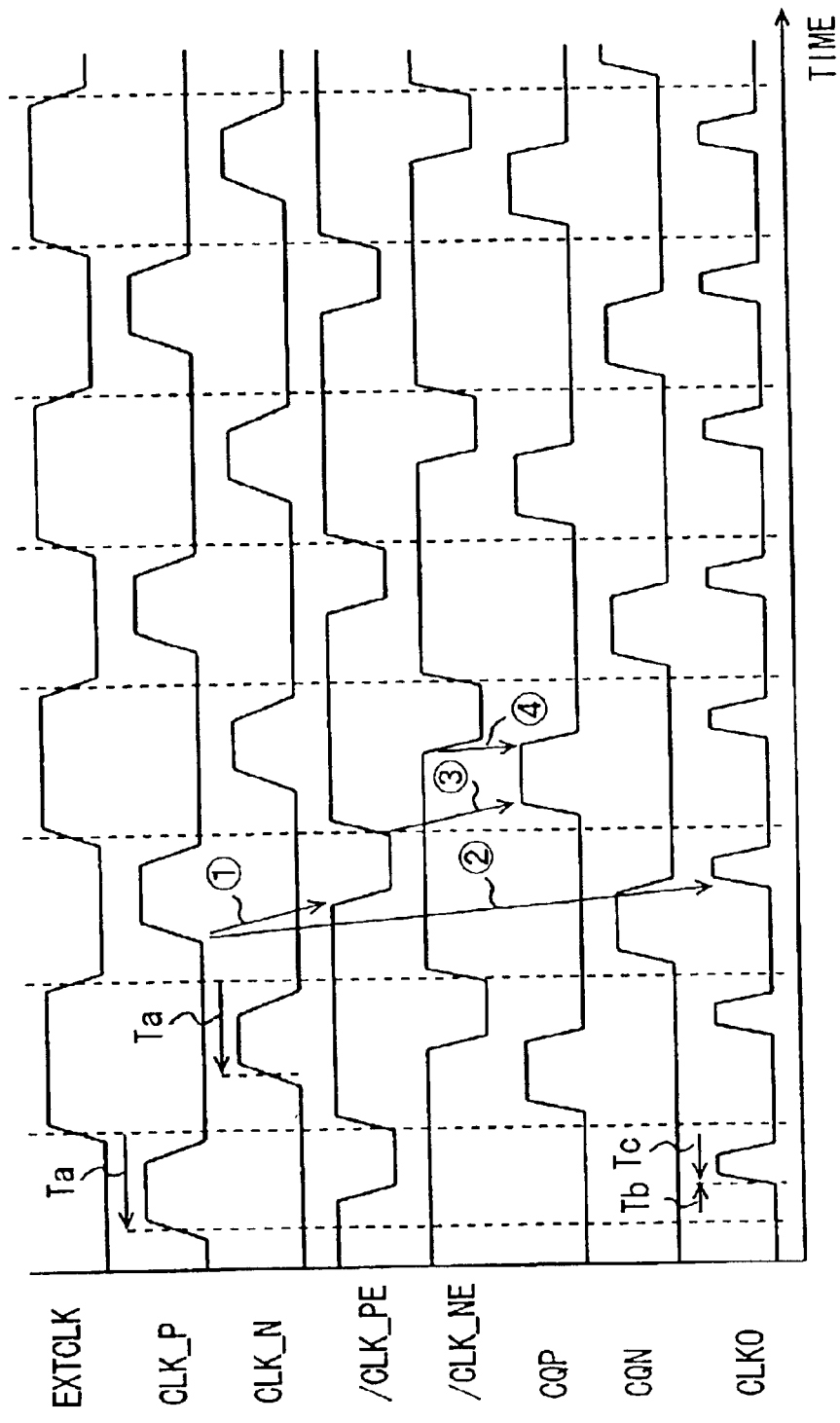
FIG. 20 is a timing chart collectively illustrating an operation timing for each signal generated in the clock generation circuit shown in FIGS. 18 and 19.
Figure 21:
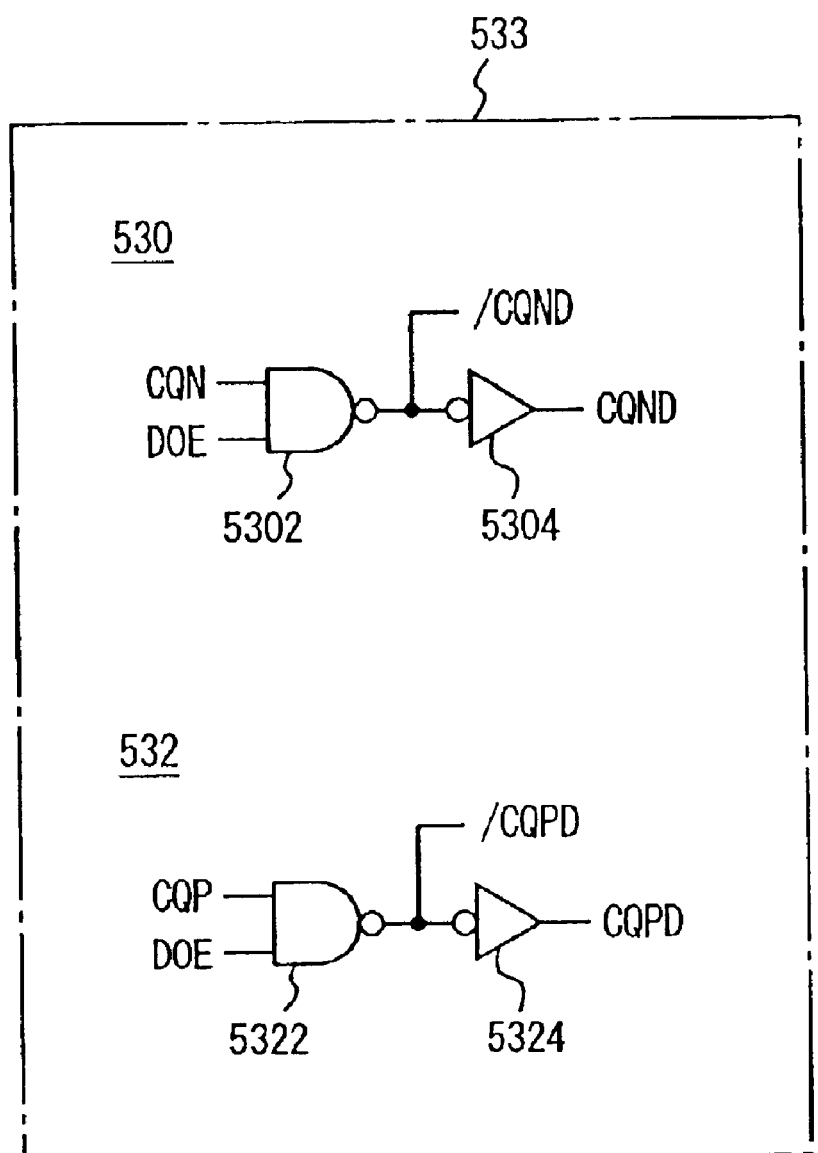
FIG. 21 is a first circuit diagram showing a configuration of the QSOE shift circuit shown in FIG. 17.
Figure 22:
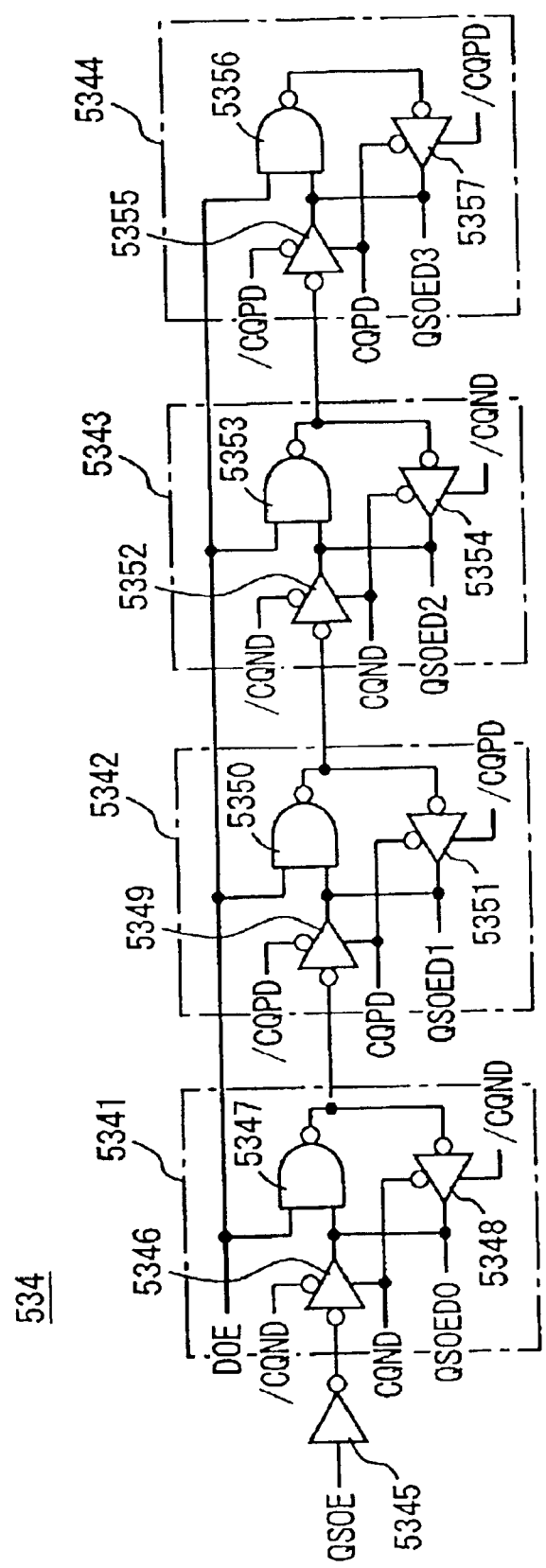
FIG. 22 is a second circuit diagram showing the configuration of the QSOE shift circuit shown in FIG. 17.
Figure 23:
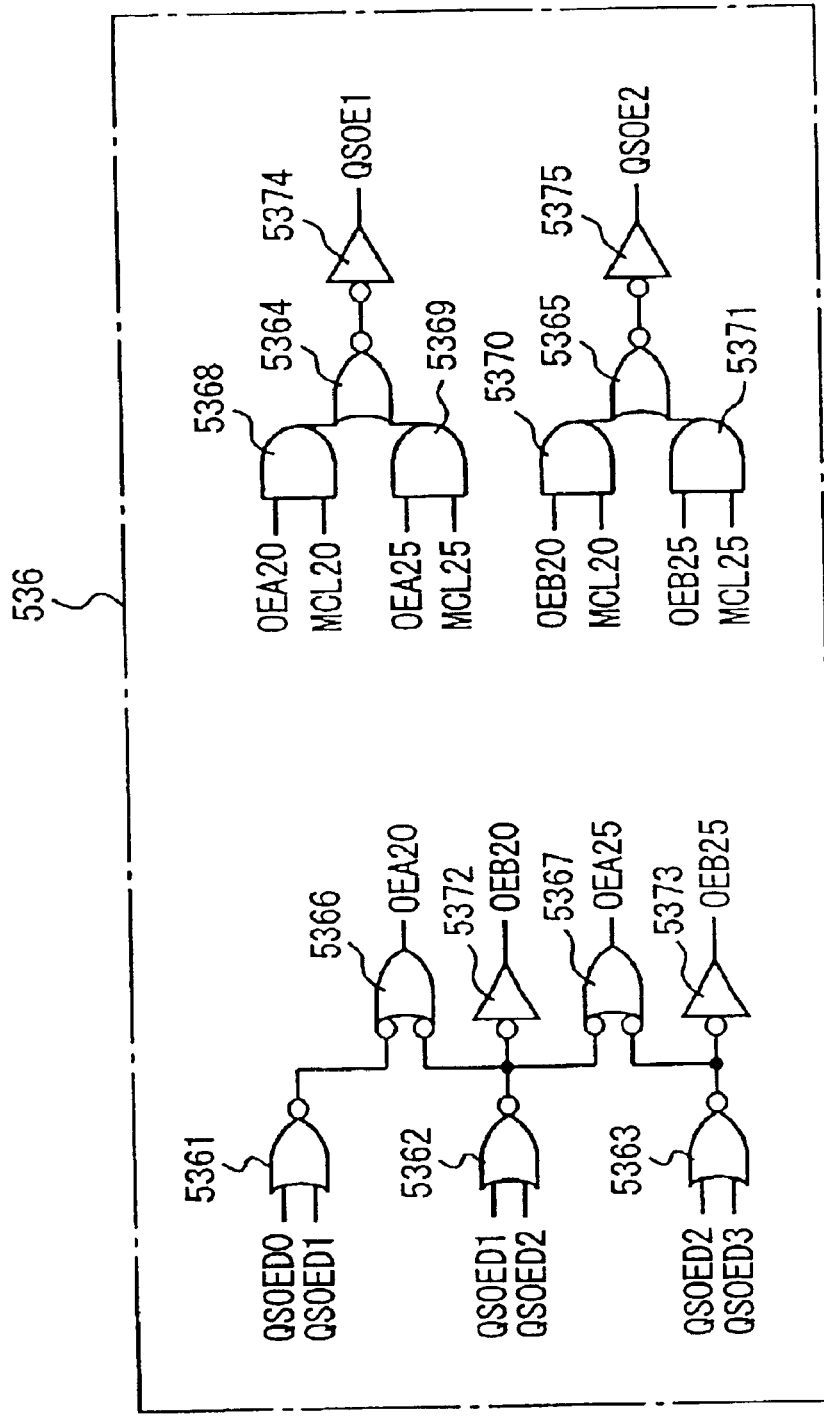
FIG. 23 is a third circuit diagram showing the configuration of the QSOE shift circuit shown in FIG. 17.
Figure 24:
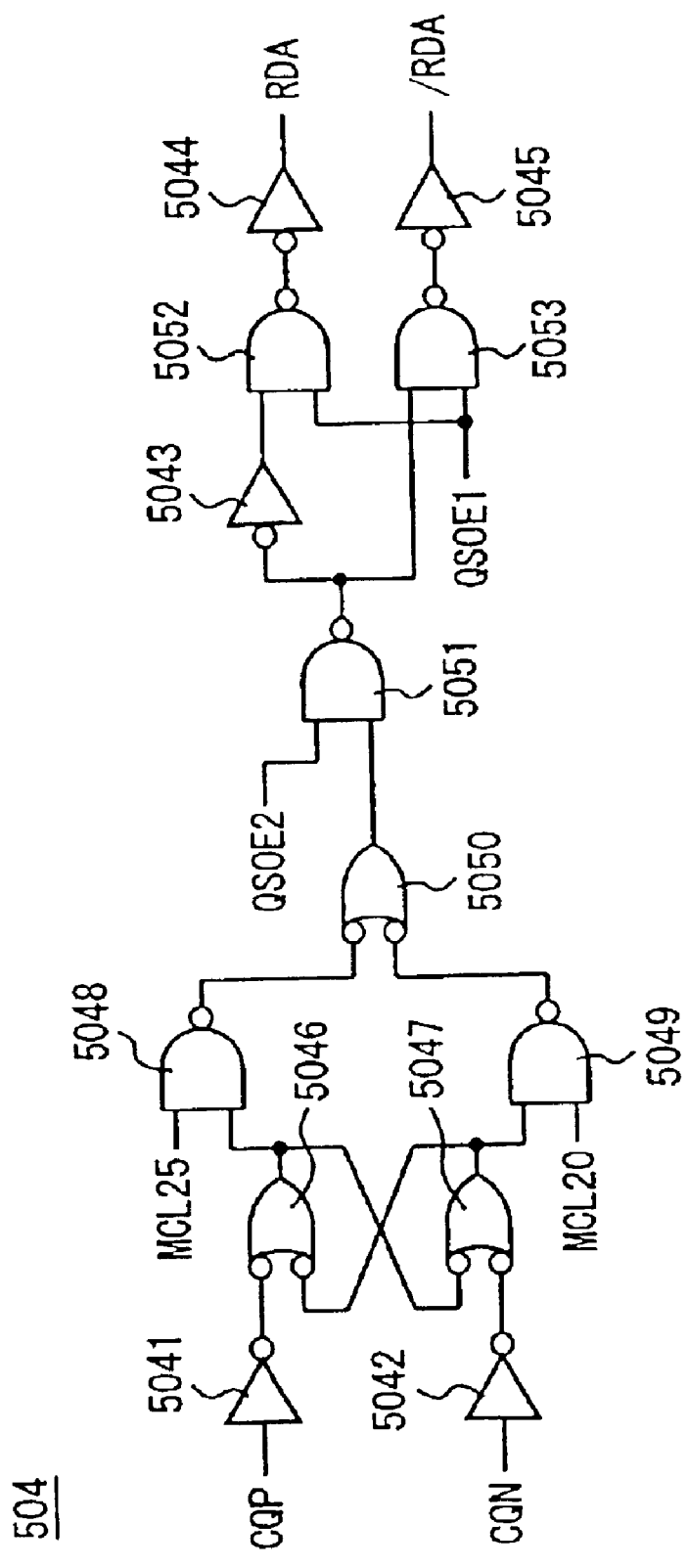
FIG. 24 is a circuit diagram showing a configuration of the output data generation circuit shown in FIG. 17.
Figure 25:
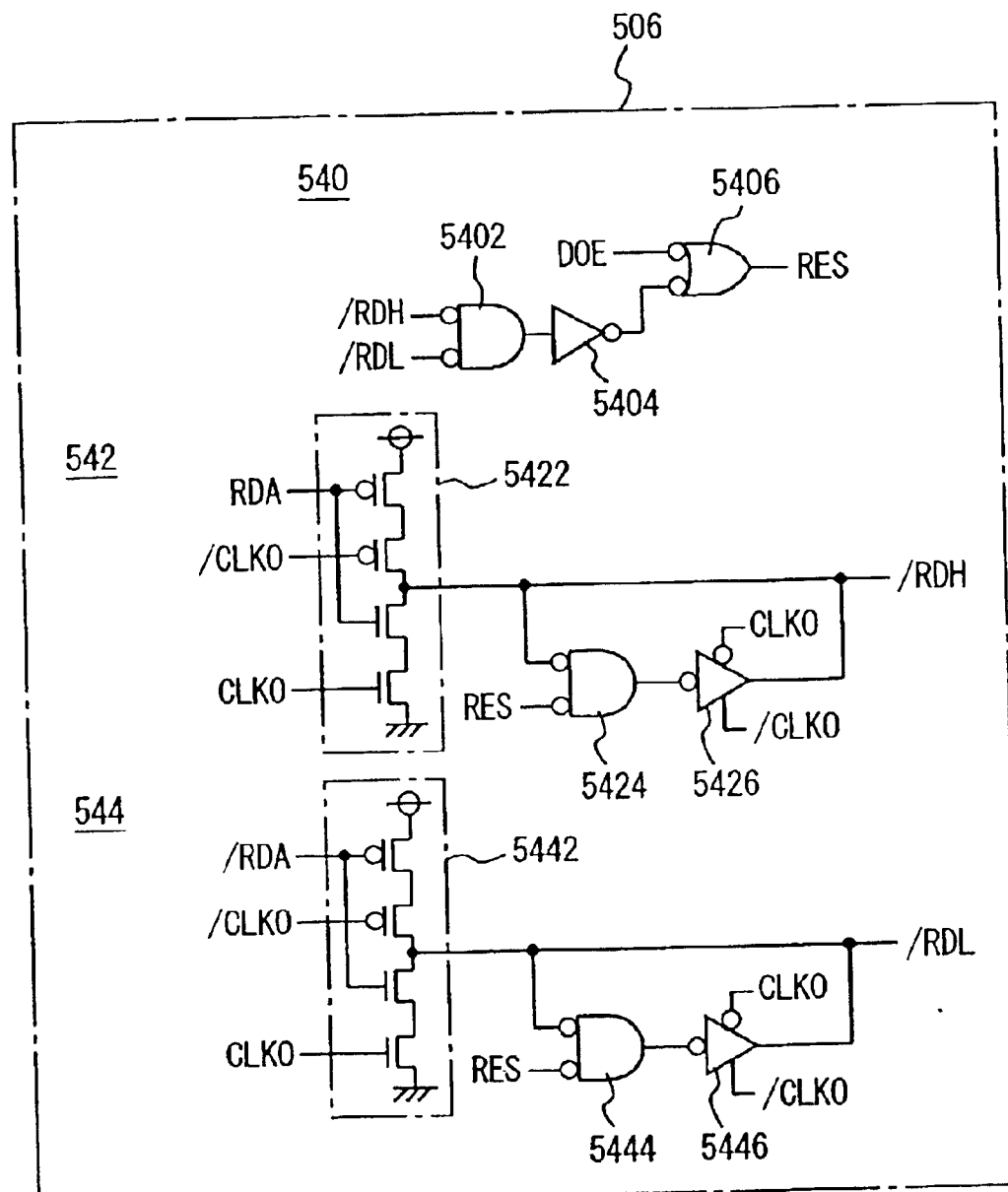
FIG. 25 is a circuit diagram showing a configuration of the output data latch circuit shown in FIG. 17.
Figure 26:
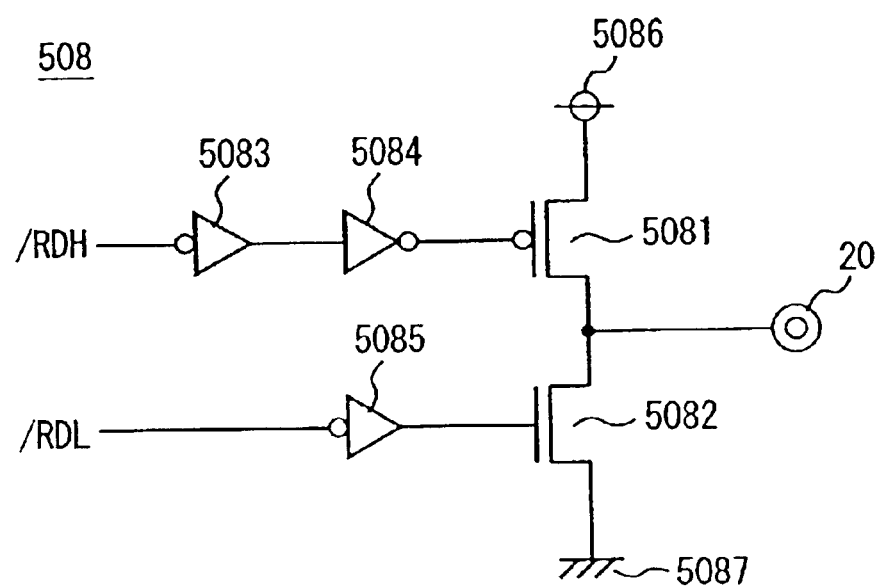
FIG. 26 is a circuit diagram showing a configuration of the output driver circuit shown in FIG. 17.
Figure 27:
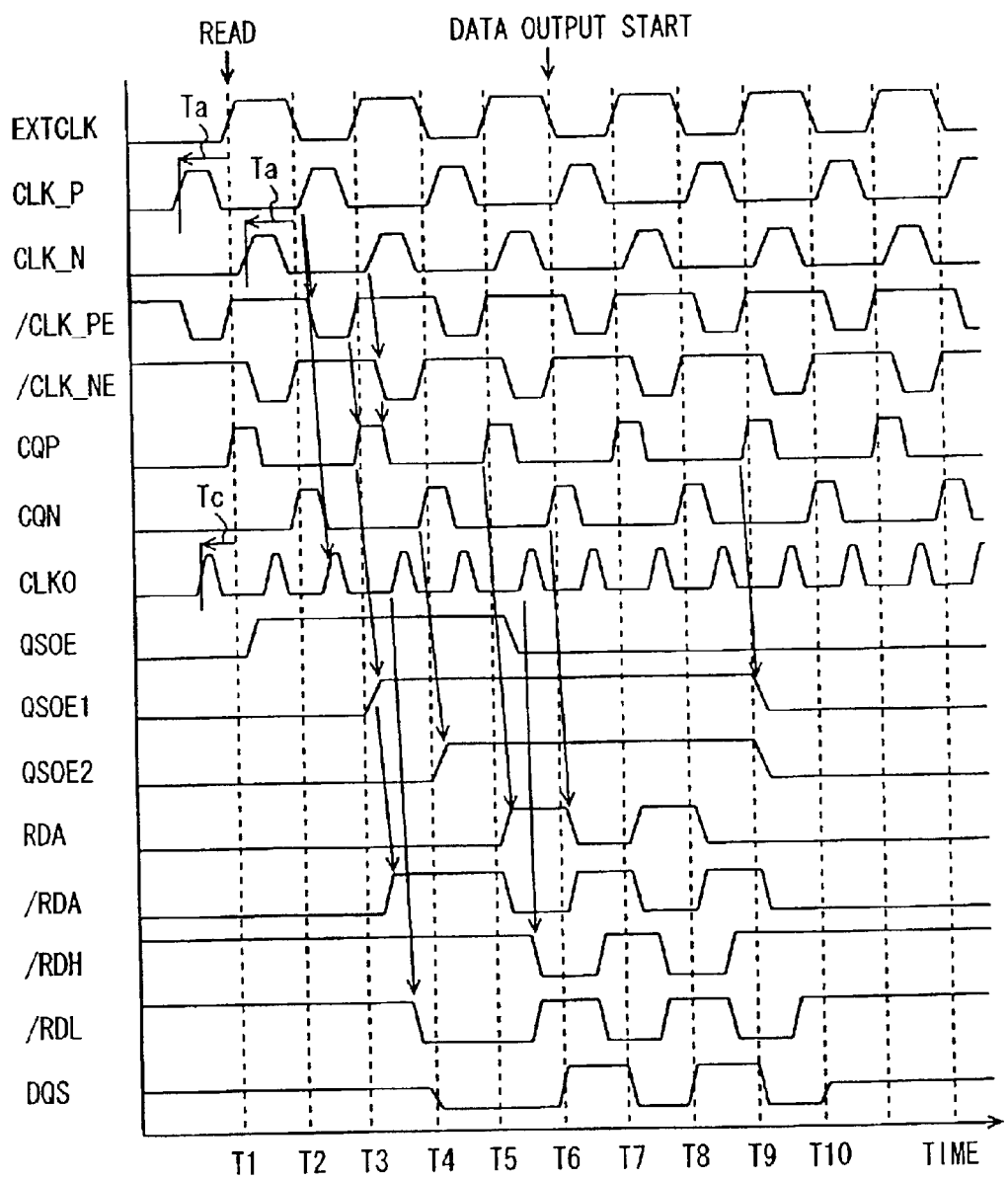
FIG. 27 is a timing chart showing waveforms of representative signals in the data strobe signal output circuit shown in FIG. 13.

Although in the first embodiment repeater 150 is provided for outputting DLL clocks CLK_P and CLK_N in response to internal signal DLLENCLK, repeater 120 same as the conventional technique shown in FIG. 15 is used in the fourth embodiment, since DLL circuit 110 is provided with the function of outputting DLL clock in response to internal signal DLLENCLK.

It is noted that in case a plurality of repeaters are provided, a repeater having a delay function may be used for repeater 120 also in the fourth embodiment, though not shown, as in the second embodiment in which repeaters 160 and 170 having the delay function are provided, in order to reduce the skew caused between data DQ output from data output circuits 200 connected to the respective repeaters.

The remaining data output circuit 200, data strobe signal output circuit 300 and READ control circuit 400 are same as those in the READ-related circuitry in semiconductor memory device 10. Therefore description thereof will not be repeated.

In the READ-related circuitry in this semiconductor memory device 10C, DLL clocks CLK_PL and CLK_NL are not output from DLL circuit 110 itself during active-standby. Therefore, as compared with semiconductor memory device 10B in the third embodiment, the current at the time of active-standby is further reduced.

In addition, also in the fourth embodiment, as in the first embodiment, in order to realize a stable operation immediately after receiving READ command in data strobe signal output circuit 300 and READ control circuit 400, data strobe signal output circuit 300 and READ control circuit 400 are supplied with internal clocks CLK_PF and CLK_NF irrespective of a data reading operation.

In addition, in order to restrict the phase difference within tDQSQ between data strobe signal DQS output by data strobe signal output circuit 300 and data DQ output by data output circuit 200, data output circuit 200 as well as data strobe signal output circuit 300 are supplied with DLL clocks CLK_P and CLK_N, and data strobe signal output circuit 300 outputs to the outside the generated data strobe signal DQS in synchronization with DLL clocks CLK_P and CLK_N.

Figure 11:
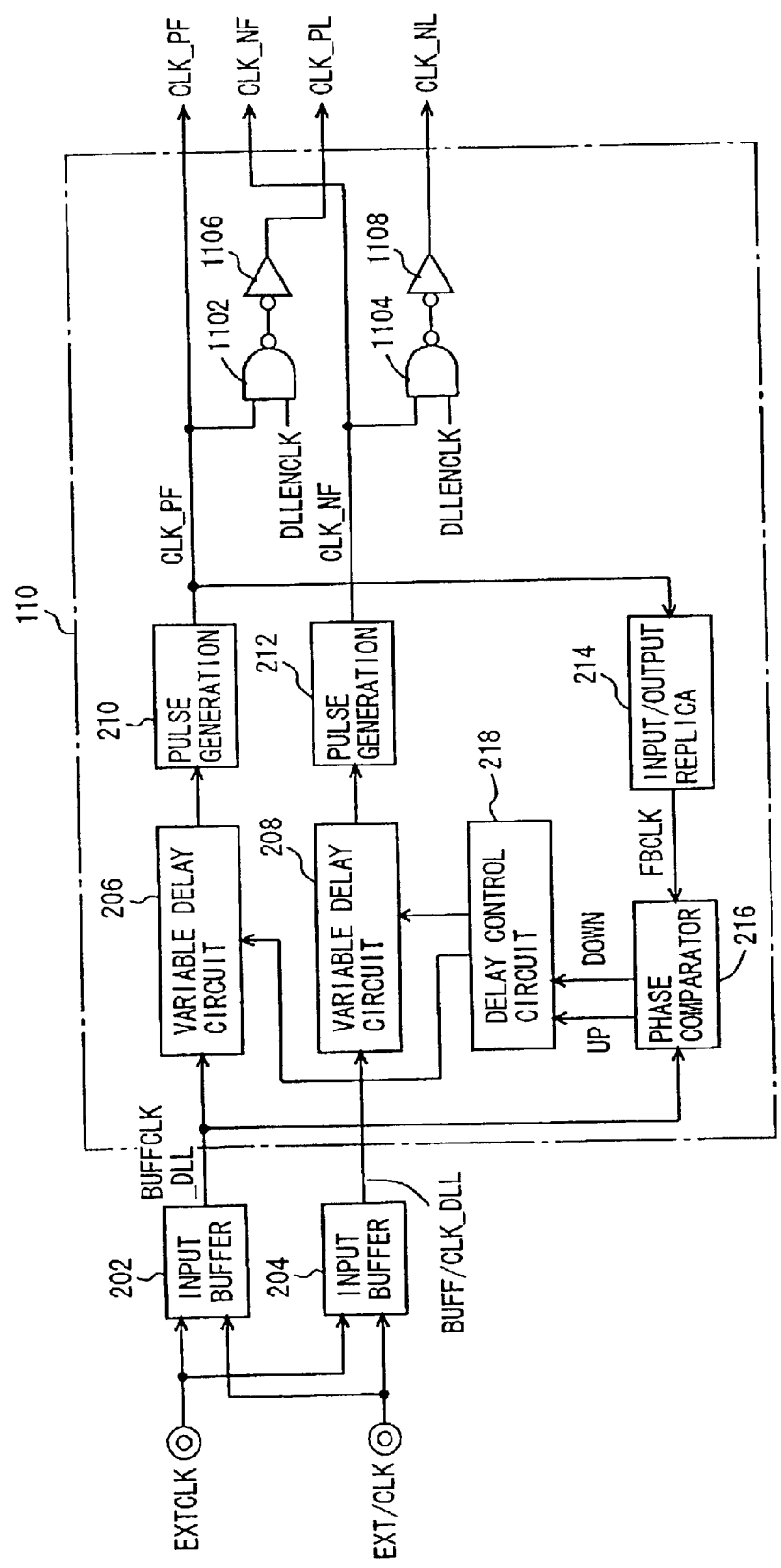
FIG. 11 is a functional block diagram illustrating the DLL circuit shown in FIG. 10.
Figure 12:
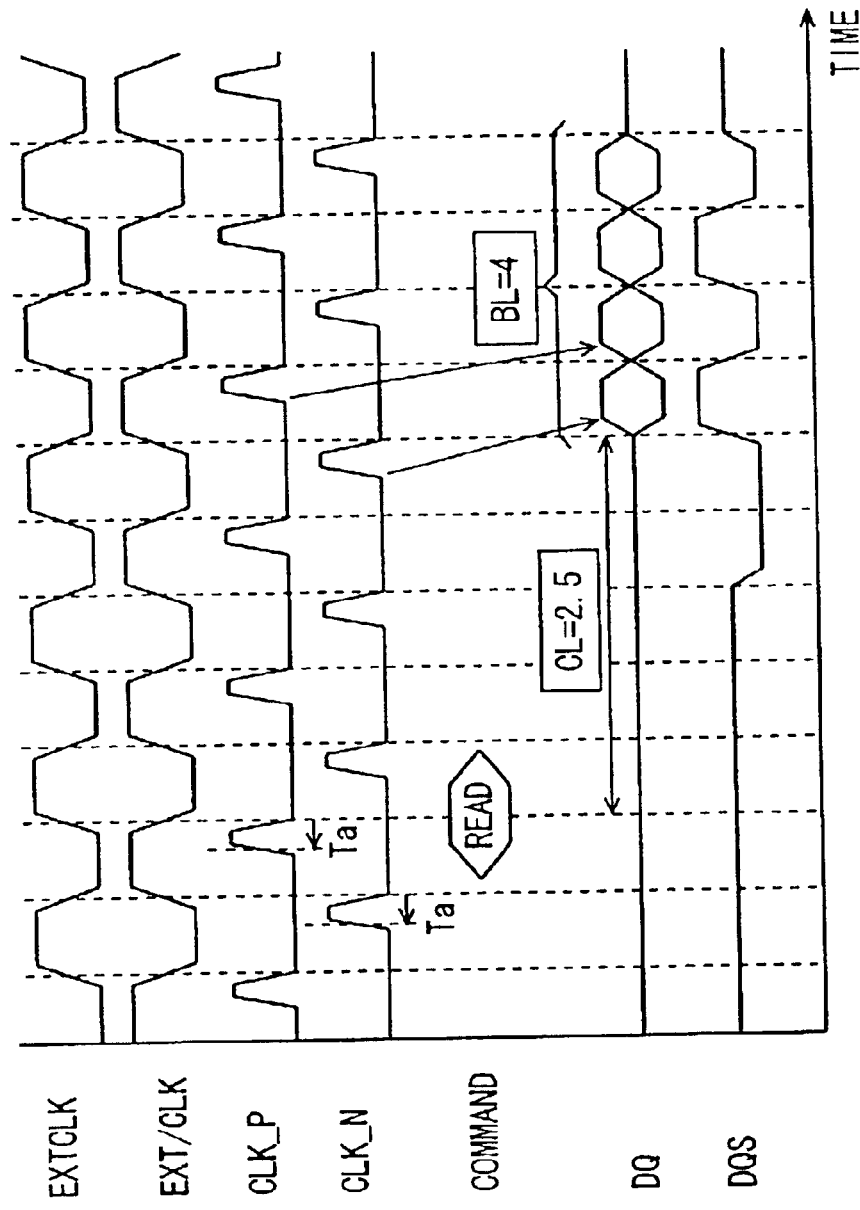
FIG. 12 is a timing chart showing a data output timing in a DDR SDRAM in reading data from the DDR SDRAM.
Figure 13:
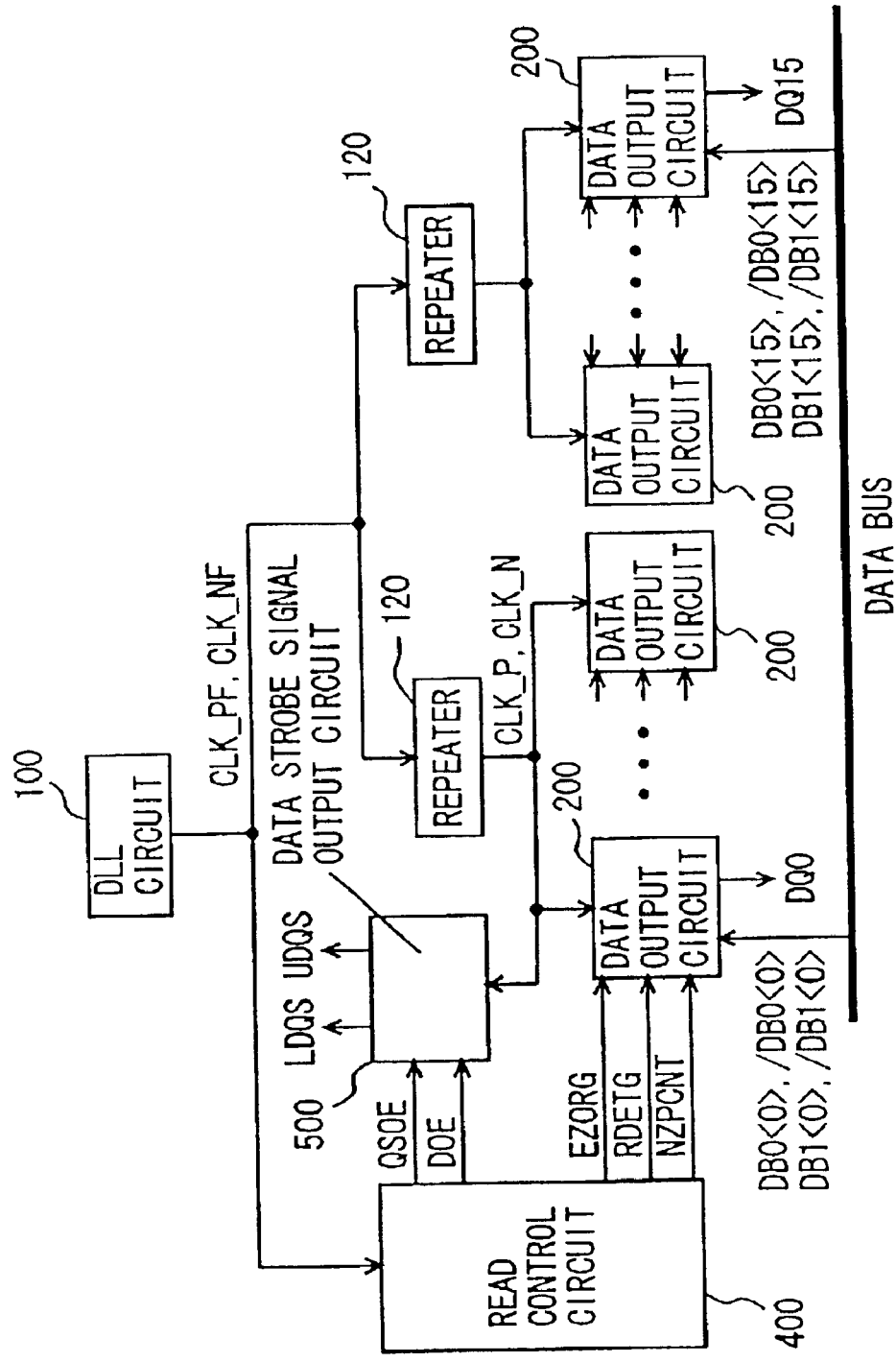
FIG. 13 is a schematic block diagram conceptually illustrating an overall configuration of an READ-related circuitry in a conventional semiconductor memory device.
Figure 14:
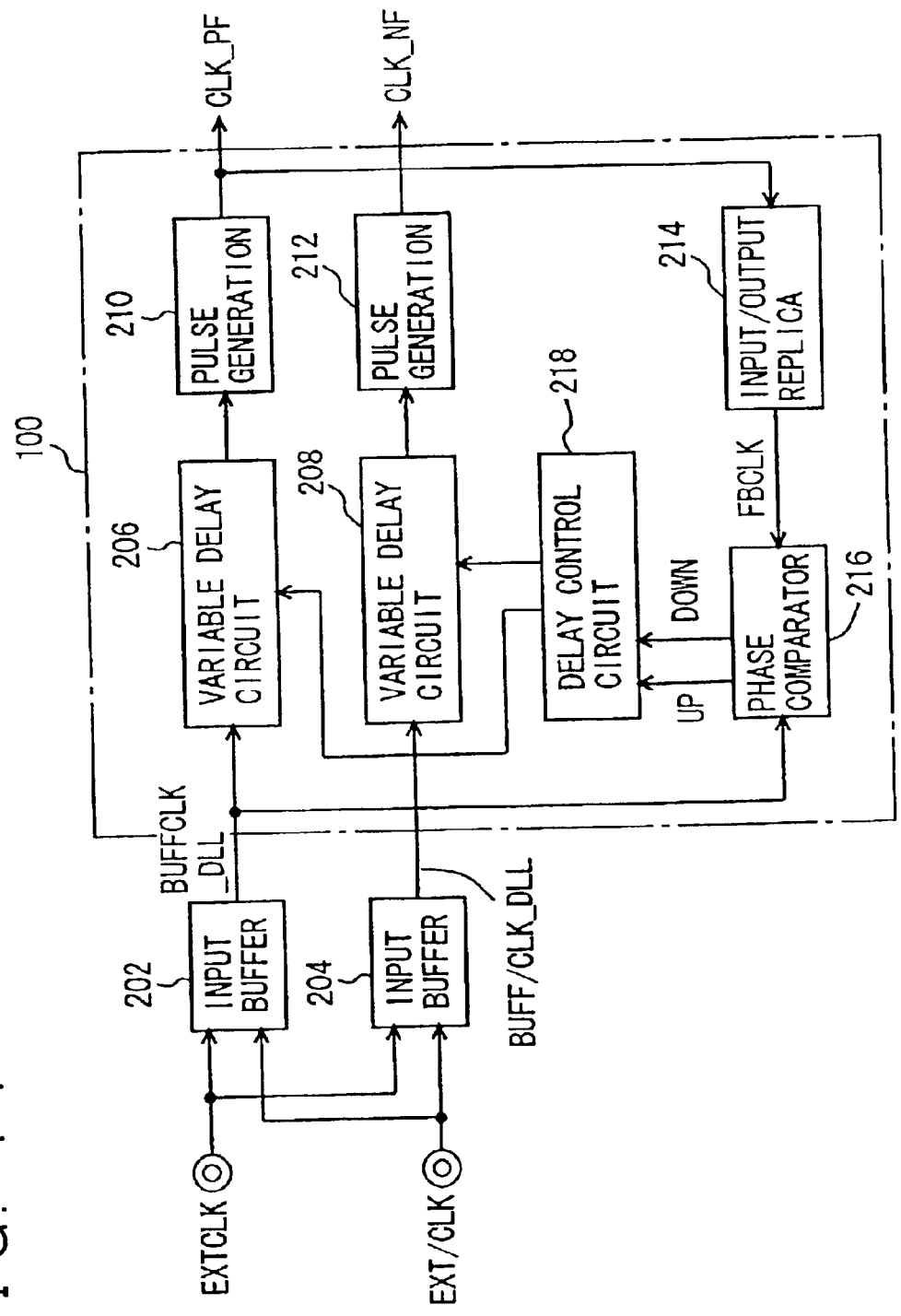
FIG. 14 is a functional block diagram illustrating the DLL circuit shown in FIG. 13.

FIG. 11 is a functional block diagram illustrating DLL circuit 110.

Referring to FIG. 11, DLL circuit 110 includes variable delay circuits 206 and 208, pulse generation circuits 210 and 212, an input/output replica circuit 214, a phase comparator 216, a delay control circuit 218, NAND gates 1102 and 1104, and inverters 1106 and 1108.

Variable delay circuits 206 and 208, pulse generation circuits 210 and 212, input/output replica circuit 214, phase comparator 216 and delay control circuit 218 are same as those in DLL circuit 100, and therefore description thereof will not be repeated.

NAND gate 1102 receives internal clock CLK_PF and internal signal DLLENCLK output from READ control circuit 400. Inverter 1106 inverts the output from NAND gate 1102 for outputting as DLL clock CLK_PL. NAND gate 1104 receives internal clock CLK_NF and internal signal DLLENCLK output from READ control circuit 400. Inverter 1108 inverts the output from NAND gate 1104 for outputting as DLL clock CLK_NL.

As described above, in accordance with semiconductor memory device 10C of the fourth embodiment, DLL clocks CLK_PL and CLK_NL are not distributed from DLL circuit 110 itself during active-standby, so that no signal is output onto the wiring for DLL clocks CLK_PL, CLK_NL and CLK_P, CLK_N and each circuit connected thereto, thereby largely reducing power consumption.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device allowing for data input/output in synchronization with a rise and a fall of an external clock, comprising:
   a memory cell array storing data;
   an internal clock generation circuit generating first and second internal clocks respectively corresponding to the rise and the fall of said external clock in synchronization with said external clock;
   at least one operation clock output circuit receiving said first and second internal clocks and outputting said first and second internal clocks respectively as first and second operation clocks in response to an output enabling signal enabling output of said first and second internal clocks;
   at least one data output circuit receiving said first and second operation clocks and externally outputting data read from said memory cell array in synchronization with said first and second operation clocks, and
   a data strobe signal output circuit receiving said first and second internal clocks and said first and second operation clocks and generating and externally outputting a data strobe signal indicative of a timing for externally outputting said read data from said data output circuit based on said first and second internal clocks and said first and second operation clocks.

2. The semiconductor memory device according to claim 1, wherein
   said output enabling signal activates said operation clock output circuit at least until said read data is externally output completely, after an instruction to read data from said memory cell array is received.

3. The semiconductor memory device according to claim 1, further comprising at least one signal recovering circuit arranged on a signal path between said internal clock generation circuit and said data output circuit for recovering a signal level output from said internal clock generation circuit, wherein
   each said at least one operation clock output circuit is provided corresponding to each said at least one signal recovering circuit and is included in each said at least one signal recovering circuit.

4. The semiconductor memory device according to claim 3, wherein said signal recovering circuit is a repeater.

5. The semiconductor memory device according to claim 3, wherein said signal recovering circuit is a buffer shaping a waveform of a signal.

6. The semiconductor memory device according to claim 1, wherein said operation clock output circuit is included in said internal clock generation circuit.

7. The semiconductor memory device according to claim 1, wherein
   said data strobe signal output circuit includes
   a signal generation circuit generating said data strobe signal based on said first and second internal clocks, and
   a signal output circuit externally outputting said data strobe signal generated by said signal generation circuit, in synchronization with said first and second operation clocks.

8. The semiconductor memory device according to claim 7, further comprising at least one signal recovering circuit arranged on a signal path between said internal clock generation circuit and said data output circuit, and recovering a signal level output from said internal clock generation circuit, wherein
   each said at least one operation clock output circuit is provided corresponding to each said at least one signal recovering circuit and is included in each said at least one signal recovering circuit.

9. The semiconductor memory device according to claim 8, wherein
   said data strobe signal output circuit further includes a delay circuit delaying said first and second internal clocks,
   said delay circuit delays said first and second internal clocks based on a delay amount of said first and second operation clocks with respect to said first and second internal clocks in said signal recovering circuit,
   said signal generation circuit generates said data strobe signal in synchronization with said first and second internal clocks delayed by said delay circuit, and said signal output circuit externally outputs said generated data strobe signal in synchronization with said first and second operation clocks.

10. The semiconductor memory device according to claim 8, wherein a plurality of said data output circuits are provided, each said at least one signal recovering circuit receives said first and second internal clocks from said internal clock generation circuit, each of said plurality of data output circuits receives said first and second operation clocks from any said at least one signal recovering circuit, and said internal clock generation circuit, said at least one signal recovering circuit and said plurality of data output circuits are provided in a hierarchical tree structure.

11. The semiconductor memory device according to claim 10, wherein a plurality of said signal recovering circuits are provided, said signal recovering circuits include a first group of signal recovering circuits outputting said first and second operation clocks to said data output circuit and a second group of signal recovering circuits outputting said first and second operation clocks to said data output circuit and said data strobe signal output circuit, each of said first and second groups of signal recovering circuits further includes a delay circuit delaying said first and second operation clocks respectively for said first and second internal clocks received from said internal clock generation circuit, and said delay circuit included in each of said first group of signal recovering circuits delays said first and second operation clocks such that a delay amount of said first and second operation clocks is larger than a delay amount by said delay circuit included in each of said second group of signal recovering circuits.

12. The semiconductor memory device according to claim 1, wherein said internal clock generation circuit includes a first input buffer circuit receiving an external reference clock formed with said external clock and a clock complimentary to said external clock to generate a third internal clock, a second input buffer circuit receiving said external reference clock to generate a fourth internal clock complimentary to said third internal clock, a first variable delay circuit delaying said third internal clock to generate said first internal clock, a second variable delay circuit delaying said fourth internal clock to generate said second internal clock, a simulation delay circuit further delaying said first internal clock by a prescribed time to generate a fifth internal clock, a phase comparator circuit comparing a phase of said fifth internal clock with a phase of said third internal clock, and a delay control circuit controlling delay amounts in said first and second variable delay circuits based on a phase comparison result from said phase comparator circuit.

* * * * *